United States Patent
Katsuno et al.

(10) Patent No.: US 7,906,827 B2
(45) Date of Patent: Mar. 15, 2011

(54) SOLID-STATE IMAGING DEVICE

(75) Inventors: Motonari Katsuno, Kyoto (JP); Ryohei Miyagawa, Kyoto (JP); Hirohisa Ohtsuki, Osaka (JP)

(73) Assignee: Panasonic Corporation, Osaka (JP)

( * ) Notice: Subject to any disclaimer, the term of this patent is extended or adjusted under 35 U.S.C. 154(b) by 182 days.

(21) Appl. No.: 12/172,548

(22) Filed: Jul. 14, 2008

(65) Prior Publication Data
US 2009/0026563 A1    Jan. 29, 2009

(30) Foreign Application Priority Data
Jul. 27, 2007  (JP) .................. 2007-196129

(51) Int. Cl.
*H01L 27/146* (2006.01)

(52) U.S. Cl. .......... 257/448; 257/436; 257/E27.131; 257/E31.001; 250/226

(58) Field of Classification Search .......... 257/432, 257/E27.131, E31.001, 436, 448; 250/226
See application file for complete search history.

(56) References Cited

U.S. PATENT DOCUMENTS

| | | | |
|---|---|---|---|
| 7,023,034 B2 * | 4/2006 | Kuriyama | 257/291 |
| 7,138,618 B2 | 11/2006 | Mishina et al. | |
| 7,420,231 B2 * | 9/2008 | Maruyama | 257/233 |
| 7,466,002 B2 * | 12/2008 | Shaffer | 257/432 |
| 2004/0159774 A1 | 8/2004 | Mishina et al. | |
| 2006/0113460 A1 * | 6/2006 | Tay | 250/208.1 |
| 2006/0267123 A1 * | 11/2006 | Wu | 257/432 |
| 2007/0045518 A1 | 3/2007 | Mishina et al. | |
| 2008/0173966 A1 * | 7/2008 | Lin | 257/459 |
| 2008/0191296 A1 * | 8/2008 | Wang et al. | 257/432 |

* cited by examiner

*Primary Examiner* — Wael M Fahmy
*Assistant Examiner* — John C Ingham
(74) *Attorney, Agent, or Firm* — McDermott Will & Emery LLP

(57) ABSTRACT

A solid-state imaging device includes a first wiring layer, a second wiring layer, a substrate contact, and a first contact. The arrangement of the substrate contact with respect to a light-receiving section forming a peripheral pixel is shifted, or not shifted, from the arrangement of the substrate contact with respect to a light-receiving section forming a central pixel, by a shift amount r from the peripheral portion toward the central portion. The arrangement of the first contact with respect to the light-receiving section of the peripheral pixel is shifted from the arrangement of the first contact with respect to the light-receiving section of the central pixel, by a shift amount s1 from the peripheral portion toward the central portion. The shift amount s1 is greater than the shift amount r.

21 Claims, 14 Drawing Sheets

With shifting (peripheral pixel)

Relationship between substrate surface, gate electrodes and bottom-layer contacts Relationship between bottom-layer contact and first-layer metal wires Relationship between first-layer metal wires and first-layer contacts Relationship between first-layer contacts and second-layer metal wires Relationship between second-layer metal wires and second-layer contacts Relationship between second-layer contacts and third-layer metal wires

FIG.6A
Relationship between first-layer metal wires and first-layer contacts
FIG.6B
Relationship between first-layer contacts and second-layer metal wires
Central pixel (with no shifting)
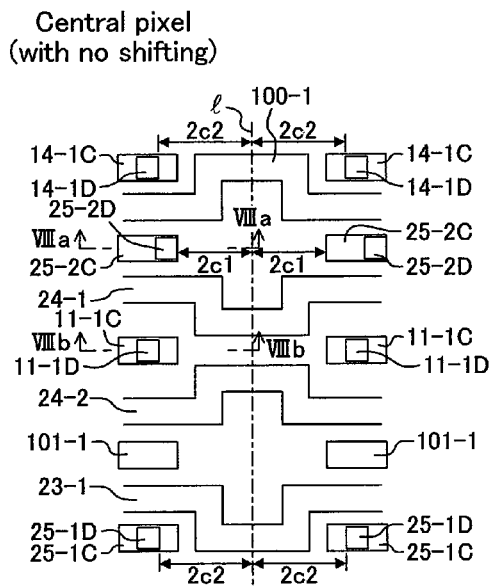
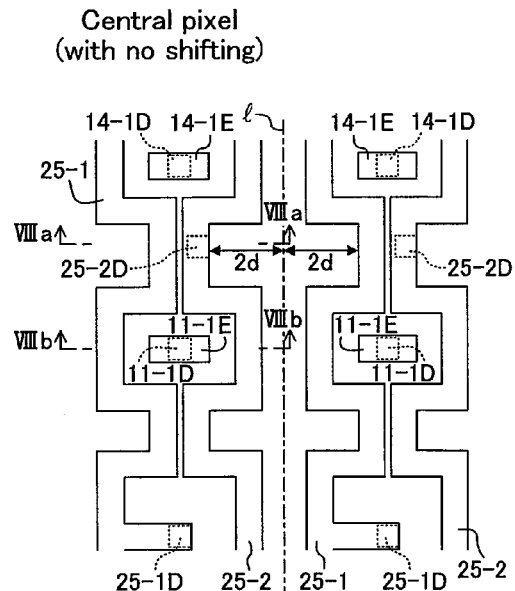
Central pixel (with no shifting)
Peripheral pixel (with shifting)
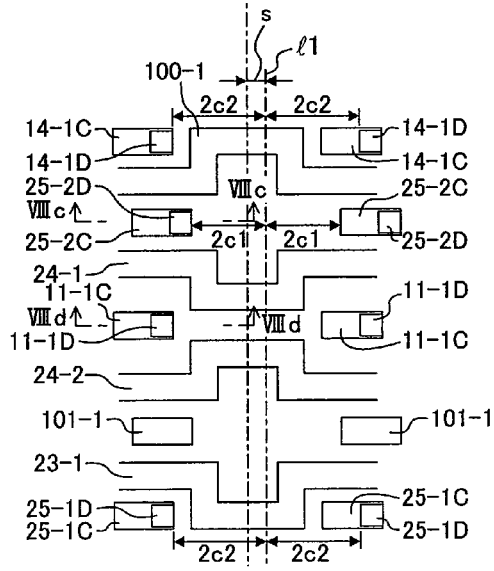
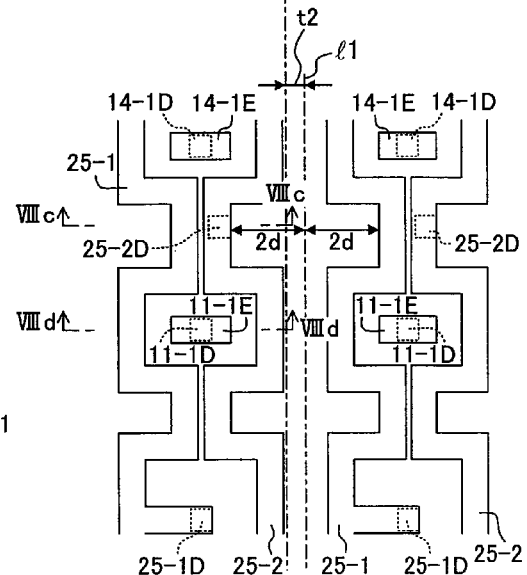
Peripheral pixel (with shifting)

FIG.7A
Relationship between second-layer metal wires and second-layer contacts
Central pixel (with no shifting)
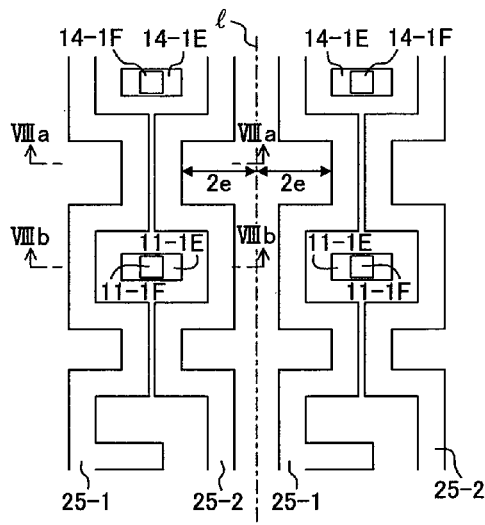
Peripheral pixel (with shifting)
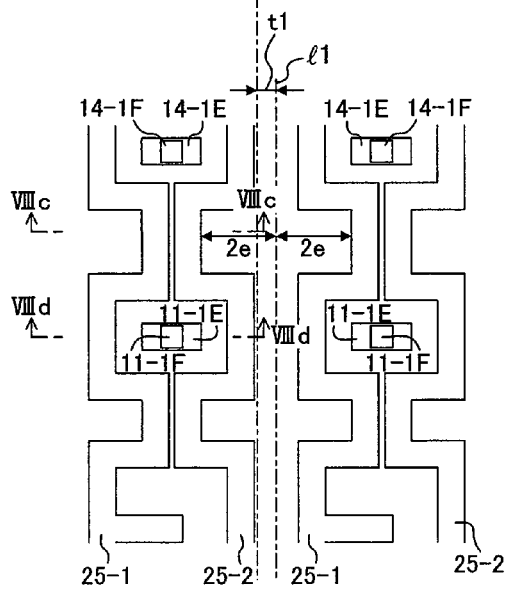
FIG.7B
Relationship between second-layer contacts and third-layer metal wires
Central pixel (with no shifting)
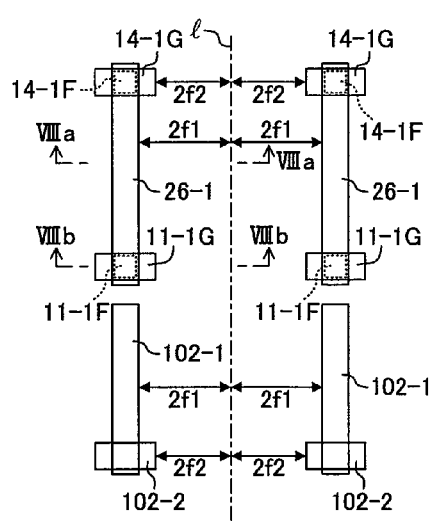
Peripheral pixel (with shifting)
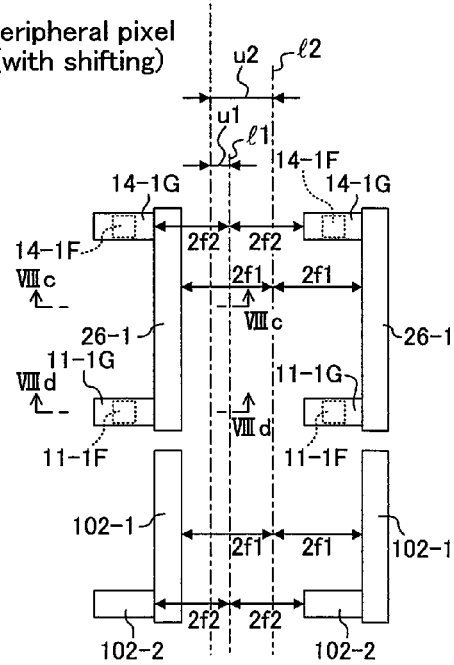

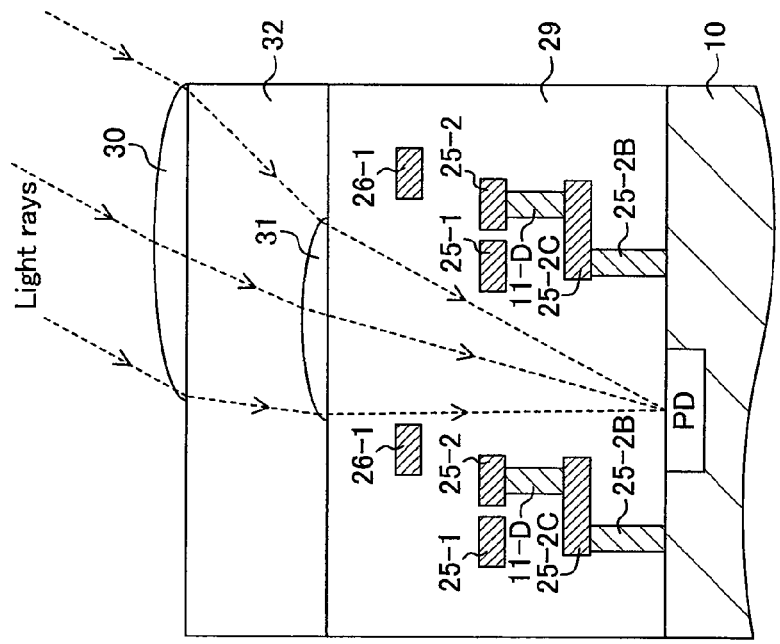
FIG.9A With no shifting (peripheral pixel)
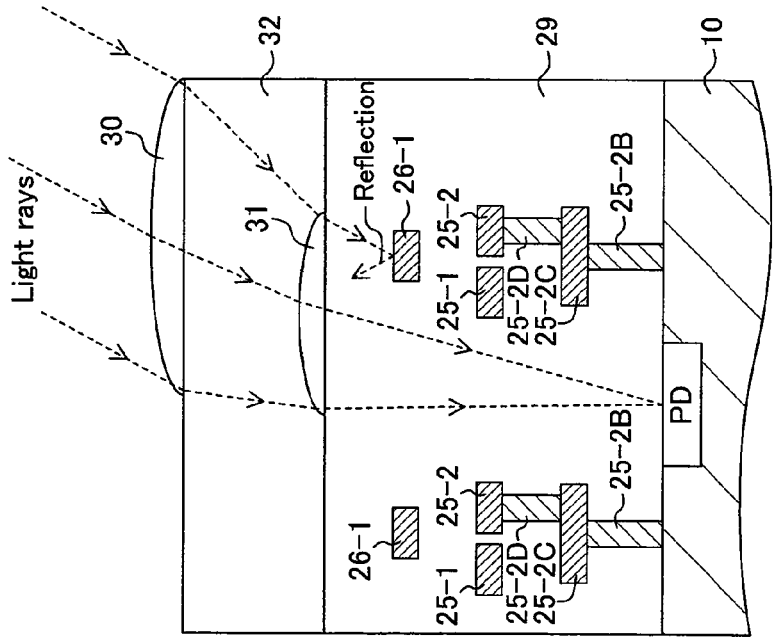
FIG.9B With shifting (peripheral pixel)

With no shifting (central pixel)

With shifting (peripheral pixel)

With no shifting (central pixel)

With shifting (central pixel)

FIG.12A
Relationship between first-layer metal wires and first-layer contacts
Central pixel (with no shifting)
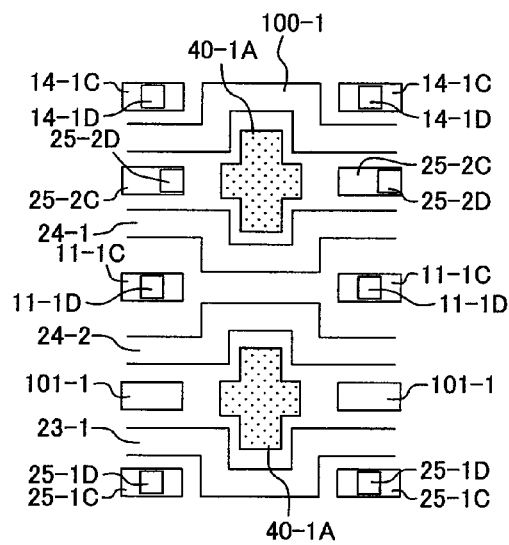
Peripheral pixel (with shifting)
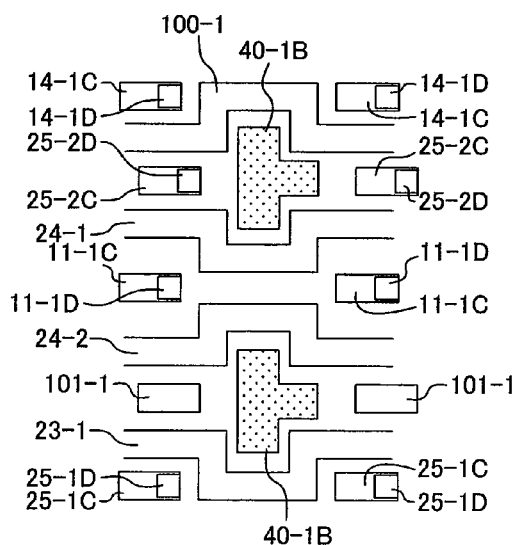
FIG.12B
Relationship between first-layer contacts and second-layer metal wires
Central pixel (with no shifting)
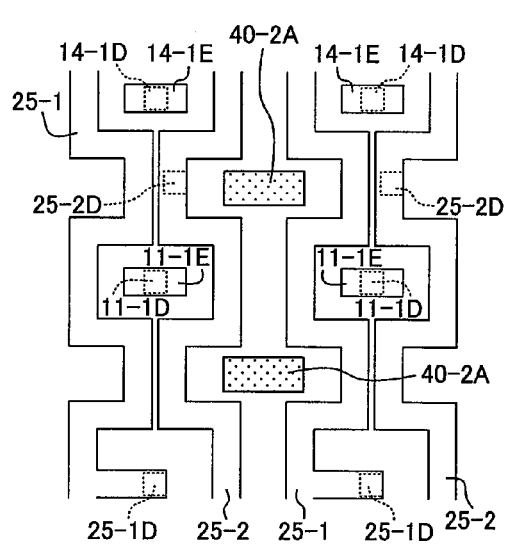
Peripheral pixel (with shifting)
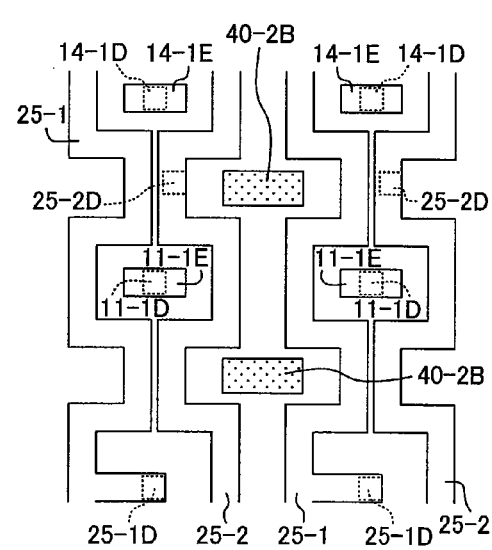

With no shifting (central pixel)

With shifting (peripheral pixel)

SOLID-STATE IMAGING DEVICE

BACKGROUND OF THE INVENTION

The present invention relates to a solid-state imaging device including a light-receiving section such as a photoelectric conversion section.

A solid-state imaging device such as a MOS image sensor, for example, typically employs a structure including a semiconductor substrate with light-receiving sections (photoelectric conversion sections such as photodiodes) provided thereon, and various films such as light-blocking patterns and wiring patterns provided in multiple layers on the semiconductor substrate. Downsizing such a solid-state imaging device will inevitably shorten the inter-pupillary distance of the camera lens, thereby increasing the amount of oblique light component being incident on a pixel array section (an imaging area) in which a plurality of pixels are provided in a two-dimensional arrangement, especially, on a peripheral portion thereof. For each pixel, as the angle of incidence of light is greater, light is more blocked by wires, and the like, thus decreasing the amount of light to be directly incident upon the light-receiving surface. Therefore, it is difficult to maintain a high level of image quality.

Many of the current solid-state imaging devices employ an on-chip microlens for each pixel for the purpose of improving the light condensing rate. However, in a peripheral portion of the imaging area where an increased amount of light is incident from an oblique direction, the center of light condensation by the condensing lens is shifted from the center of the light-receiving section. This reduces the rate of light condensation onto the light-receiving section, thus deteriorating the sensitivity. The degree of sensitivity deterioration increases from the central portion of the imaging area toward the peripheral portion thereof.

In view of this problem, a conventional solid-state imaging device proposed in the art employs a structure where the condensing lenses in the imaging area are shifted and only the uppermost wiring layer is shifted (see, for example, Japanese Patent No. 3709873).

FIG. 14 is a cross-sectional view showing an important part of the structure of this conventional solid-state imaging device.

As shown in FIG. 14, light-receiving sensor sections 101 are formed in an upper portion of a semiconductor substrate 100, and first to third wiring layers 103 to 105 are formed on the semiconductor substrate 100 and the light-receiving sensor sections 101 with an interlayer insulating layer 102 being interposed therebetween. A color filter 107 is formed on the uppermost third wiring layer 105 with a flattening film 106 being interposed therebetween.

In the conventional solid-state imaging device having such a structure, the condensing lenses (not shown) are arranged so that the centers thereof are at a constant pitch across the entire pixel area. In the peripheral portion of the imaging area, the arrangement of the condensing lenses with respect to the light-receiving sensor sections 101 are shifted in the horizontal direction or in the vertical direction from the peripheral portion of the imaging area toward the central portion thereof as indicated by the arrow b. Only with the shifting of the condensing lenses, incident light may be blocked by the uppermost wiring layer, thus deteriorating the sensitivity. In order to prevent this, only the uppermost third wiring layer 105, which is farthest away from the light-receiving sensor sections 101, is shifted in the peripheral portion of the imaging area.

Thus, with the structure where only the uppermost wiring layer is shifted only in one of the horizontal direction and the vertical direction, it is possible, despite the simple connection/layout of wiring layers, to prevent oblique incident light in the peripheral portion of the imaging area from being intercepted by the uppermost wiring layer, thus improving the rate of light condensation onto the light-receiving section and preventing the sensitivity deterioration.

Downsizing a solid-state imaging device will inevitably shorten the inter-pupillary distance of the camera lens, thereby increasing the angle of incidence of light in the pixel array section (the imaging area) in which a plurality of pixels are provided in a two-dimensional arrangement, especially, in the peripheral portion thereof, with the increased angle of incidence being about 25° to 35° with respect to the vertical direction to the substrate surface. Therefore, just shifting the uppermost wiring layer as in the conventional solid-state imaging device is not sufficient for ensuring a desirable sensitivity, with the presence of the lower wiring layers intercepting the incident light to significantly deteriorate the sensitivity.

Where not only the uppermost wiring layer but also the lower wiring layers are to be shifted, it is difficult to realize a solid-state imaging device having such a layout that all elements of wiring layers are shifted because the wiring layers are electrically connected to each other via contacts.

SUMMARY OF THE INVENTION

In view of the above, an object of the present invention is to provide a solid-state imaging device having such a structure that the sensitivity deterioration in the peripheral portion of the imaging area can be suppressed while maintaining the connection between the wiring layers with a simple layout, and a method for producing the same.

In order to achieve the object set forth above, the present invention in one embodiment is directed to a solid-state imaging device including an imaging area formed by a plurality of pixels arranged in a matrix pattern on a semiconductor substrate, each pixel including a light-receiving section for photoelectrically converting incident light, the solid-state imaging device including: a first wiring layer formed on the semiconductor substrate with a first interlayer insulating layer being interposed therebetween, the first wiring layer including a plurality of elements each having a first opening above a corresponding one of the light-receiving sections; a second wiring layer formed on the first wiring layer with a second interlayer insulating layer being interposed therebetween, the second wiring layer including a plurality of elements each having a second opening above a corresponding one of the light-receiving sections; a substrate contact running through the first interlayer insulating layer so as to electrically connect an active region of the semiconductor substrate with the first wiring layer; and a first contact running through the second interlayer insulating layer so as to electrically connect the first wiring layer with the second wiring layer, wherein: an arrangement of the substrate contact with respect to the light-receiving section of the pixel located in a peripheral portion of the imaging area is shifted, or not shifted, from an arrangement of the substrate contact with respect to the light-receiving section of the pixel located in a central portion of the imaging area, by a shift amount r (where 0<r) from the peripheral portion toward the central portion; an arrangement of the first contact with respect to the light-receiving section of the pixel located in the peripheral portion of the imaging area is shifted from an arrangement of the first contact with respect to the light-receiving section of the pixel located in the central portion of the imaging area, by a shift amount s1 (where 0<s1) from the peripheral portion toward the central portion; and where the substrate contact in the peripheral portion of the imaging area is shifted, the shift amount s1 is greater than the shift amount r.

In one embodiment, the present invention is directed to the solid-state imaging device, wherein: an arrangement of the first wiring layer with respect to the light-receiving section of the pixel located in the peripheral portion of the imaging area is shifted from an arrangement of the first wiring layer with respect to the light-receiving section of the pixel located in the central portion of the imaging area, by a shift amount s2 (where 0<s2) from the peripheral portion toward the central portion; and where the substrate contact in the peripheral portion of the imaging area is shifted, the shift amount s2 is greater than the shift amount r.

In one embodiment, the present invention is directed to the solid-state imaging device, wherein the shift amount s1 and the shift amount s2 are equal to each other.

In one embodiment, the present invention is directed to the solid-state imaging device, wherein only some of the elements of the first wiring layer are shifted by the shift amount s2.

In one embodiment, the present invention is directed to the solid-state imaging device, wherein the some of the elements of the first wiring layer are connected directly to the first contact.

In one embodiment, the present invention is directed to the solid-state imaging device, further including: a third wiring layer formed on the second wiring layer with a third interlayer insulating layer being interposed therebetween, the third wiring layer including a plurality of elements each having a third opening above a corresponding one of the light-receiving sections; and a second contact running through the third interlayer insulating layer so as to electrically connect the second wiring layer with the third wiring layer, wherein: an arrangement of the second contact with respect to the light-receiving section of the pixel located in the peripheral portion of the imaging area is shifted from an arrangement of the second contact with respect to the light-receiving section of the pixel located in the central portion of the imaging area, by a shift amount t1 (where 0<t1) from the peripheral portion toward the central portion; and the shift amount t1 is greater than or equal to the shift amount s1.

In one embodiment, the present invention is directed to the solid-state imaging device, wherein: an arrangement of the second wiring layer with respect to the light-receiving section of the pixel located in the peripheral portion of the imaging area is shifted from an arrangement of the second wiring layer with respect to the light-receiving section of the pixel located in the central portion of the imaging area, by a shift amount t2 (where 0<t2) from the peripheral portion toward the central portion; and the shift amount t2 is greater than or equal to the shift amount s1.

In one embodiment, the present invention is directed to the solid-state imaging device, wherein all of the elements of the second wiring layer are shifted by the shift amount t2.

In one embodiment, the present invention is directed to the solid-state imaging device, wherein the shift amount t2 is equal to the shift amount t1.

In one embodiment, the present invention is directed to the solid-state imaging device, wherein: an arrangement of some of the elements of the third wiring layer with respect to the light-receiving section of the pixel located in the peripheral portion of the imaging area is shifted from an arrangement of some of the elements of the third wiring layer with respect to the light-receiving section of the pixel located in the central portion of the imaging area, by a shift amount u1 (where 0<u1) from the peripheral portion toward the central portion; an arrangement of some other ones of the elements of the third wiring layer with respect to the light-receiving section of the pixel located in the peripheral portion of the imaging area is shifted from an arrangement of some other ones of the elements of the third wiring layer with respect to the light-receiving section of the pixel located in the central portion of the imaging area, by a shift amount u2 (where 0<u2) from the peripheral portion toward the central portion; and the shift amount u1 and the shift amount u2 are different from each other and are greater than the shift amount t1.

In one embodiment, the present invention is directed to the solid-state imaging device, further including: a first wiring protection film formed between the first wiring layer and the second interlayer insulating layer; a second wiring protection film formed between the second wiring layer and the third interlayer insulating layer; and a third wiring protection film formed on the third wiring layer.

In one embodiment, the present invention is directed to the solid-state imaging device, wherein the first wiring protection film and the second wiring protection film are each a layered film formed by using at least two or more of a silicon nitride film, a silicon oxynitride film and a silicon oxide film.

In one embodiment, the present invention is directed to the solid-state imaging device, wherein: the first wiring protection film has an opening connected to the first opening above each one of the light-receiving sections; and the second wiring protection film has an opening connected to the second opening above each one of the light-receiving sections.

In one embodiment, the present invention is directed to the solid-state imaging device, wherein a shape of the opening connected to the first opening and that of the opening connected to the second opening change pixel by pixel from the peripheral portion of the imaging area toward the central portion thereof.

In one embodiment, the present invention is directed to the solid-state imaging device, wherein a shape of the opening connected to the first opening and that of the opening connected to the second opening in the peripheral portion of the imaging area are different from those in the central portion of the imaging area.

In one embodiment, the present invention is directed to the solid-state imaging device, wherein: an arrangement of the opening connected to the first opening provided above the light-receiving section of the pixel located in the peripheral portion of the imaging area is shifted from an arrangement of the opening connected to the first opening provided above the light-receiving section of the pixel located in the central portion of the imaging area, by a shift amount s2 from the peripheral portion toward the central portion; and an arrangement of the opening connected to the second opening provided above the light-receiving section of the pixel located in the peripheral portion of the imaging area is shifted from an arrangement of the opening connected to the second opening provided above the light-receiving section of the pixel located in the central portion of the imaging area, by a shift amount t2 from the peripheral portion toward the central portion.

In one embodiment, the present invention is directed to the solid-state imaging device, wherein: an area of the opening connected to the first opening provided above the light-receiving section of the pixel located in the peripheral portion of the imaging area is smaller than an area of the opening connected to the first opening provided above the light-receiving section of the pixel located in the central portion of the imaging area; and an area of the opening connected to the second opening provided above the light-receiving section of the pixel located in the peripheral portion of the imaging area is smaller than an area of the opening connected to the second opening provided above the light-receiving section of the pixel located in the central portion of the imaging area.

In one embodiment, the present invention is directed to the solid-state imaging device, wherein the third wiring protection film does not have an opening connected to the third opening above each one of the light-receiving sections.

In one embodiment, the present invention is directed to the solid-state imaging device, further including an on-chip microlens, a color filter, and an inner-layer lens, wherein an arrangement of the on-chip microlens, the color filter and the inner-layer lens provided above the light-receiving section of the pixel located in the peripheral portion of the imaging area is shifted from an arrangement of the on-chip microlens, the color filter and the inner-layer lens provided above the light-receiving section of the pixel located in the central portion of the imaging area, from the peripheral portion toward the central portion.

In one embodiment, the present invention is directed to the solid-state imaging device, wherein the shifting from the peripheral portion toward the central portion is a shifting in a horizontal direction or in a vertical direction.

As described above, with a solid-state imaging device and a method for producing the same of the present invention, it is possible to efficiently condense the incident light onto the light-receiving section in the peripheral portion of the imaging area to thereby suppress the sensitivity deterioration, while maintaining the connection between the wiring layers with a simple layout.

BRIEF DESCRIPTION OF THE DRAWINGS

FIG. 6A shows the arrangement of the first-layer metal wires and the first-layer contacts of the solid-state imaging device according to the first embodiment of the present invention, wherein the upper portion of the figure is a plan view showing the arrangement with no shifting in a central pixel, and the lower portion thereof is a plan view showing the arrangement with wire shifting in a peripheral pixel; and FIG. 6B shows the arrangement of the first-layer contacts and the second-layer metal wires of the solid-state imaging device according to the first embodiment of the present invention, wherein the upper portion of the figure is a plan view showing the arrangement with no wire shifting in a central pixel, and the lower portion thereof is a plan view showing the arrangement with wire shifting in a peripheral pixel.

FIG. 7A shows the arrangement of the second-layer metal wires and the second-layer contacts of the solid-state imaging device according to the first embodiment of the present invention, wherein the upper portion of the figure is a plan view showing the arrangement with no wire shifting in a central pixel, and the lower portion thereof is a plan view showing the arrangement with wire shifting in a peripheral pixel; and FIG. 7B shows the arrangement of the second-layer contacts and the third-layer metal wires of the solid-state imaging device according to the first embodiment of the present invention, wherein the upper portion of the figure is a plan view showing the arrangement with no wire shifting in a central pixel, and the lower portion thereof is a plan view showing the arrangement with wire shifting in a peripheral pixel.

FIGS. 8A and 8B are cross-sectional views showing a central pixel of the solid-state imaging device according to the first embodiment of the present invention, wherein FIG. 8A shows a cross section of up to the substrate taken along line VIIIa-VIIIa in FIGS. 6A and 6B and FIGS. 7A and 7B, and FIG. 8B shows a cross section of up to the substrate taken along line VIIIb-VIIIb in FIGS. 6A and 6B and FIGS. 7A and 7B; and FIGS. 8C and 8D are cross-sectional views showing a peripheral pixel of the solid-state imaging device according to the first embodiment of the present invention, wherein FIG. 8C shows a cross section of up to the substrate taken along line VIIIc-VIIIc in FIGS. 6A and 6B and FIGS. 7A and 7B, and FIG. 8D shows a cross section of up to the substrate taken along line VIIId-VIIId in FIGS. 6A and 6B and FIGS. 7A and 7B.

FIGS. 9A and 9B are cross-sectional views showing a peripheral pixel of the solid-state imaging device according to the first embodiment of the present invention, wherein FIG. 9A is a cross-sectional view showing an arrangement with no wire shifting, and FIG. 9B is a cross-sectional view showing an arrangement with wire shifting.

FIG. 12A shows the arrangement of openings provided in the wiring protection film on the first-layer metal wires in the arrangement of the first-layer metal wires and the first-layer contacts of the solid-state imaging device according to the second embodiment of the present invention, wherein the upper portion of the figure is a plan view showing the arrangement with no wire shifting in a central pixel, and the lower portion thereof is a plan view showing the arrangement with wire shifting in a peripheral pixel; and FIG. 12B shows the arrangement of openings provided in the wiring protection film on the second-layer metal wires in the arrangement of the first-layer contacts and the second-layer metal wires of the solid-state imaging device according to the second embodiment of the present invention, wherein the upper portion of the figure is a plan view showing the arrangement with no wire shifting in a central pixel, and the lower portion thereof is a plan view showing the arrangement with wire shifting in a peripheral pixel.

FIGS. 13A and 13B are cross-sectional views each showing a structure of a solid-state imaging device according to a variation of the second embodiment of the present invention, wherein FIG. 13A is a cross-sectional view showing an arrangement with no wire shifting in a central pixel, and FIG. 13B is a cross-sectional view showing an arrangement with wire shifting in a peripheral pixel.

DESCRIPTION OF THE PREFERRED EMBODIMENTS

Solid-state imaging devices of preferred embodiments of the present invention will now be described with reference to the drawings, each being a MOS image sensor (a CMOS image sensor) as an example.

First Embodiment

A solid-state imaging device according to a first embodiment of the present invention will now be described.

—Basic Configuration of Imaging Area—

Figure 1:
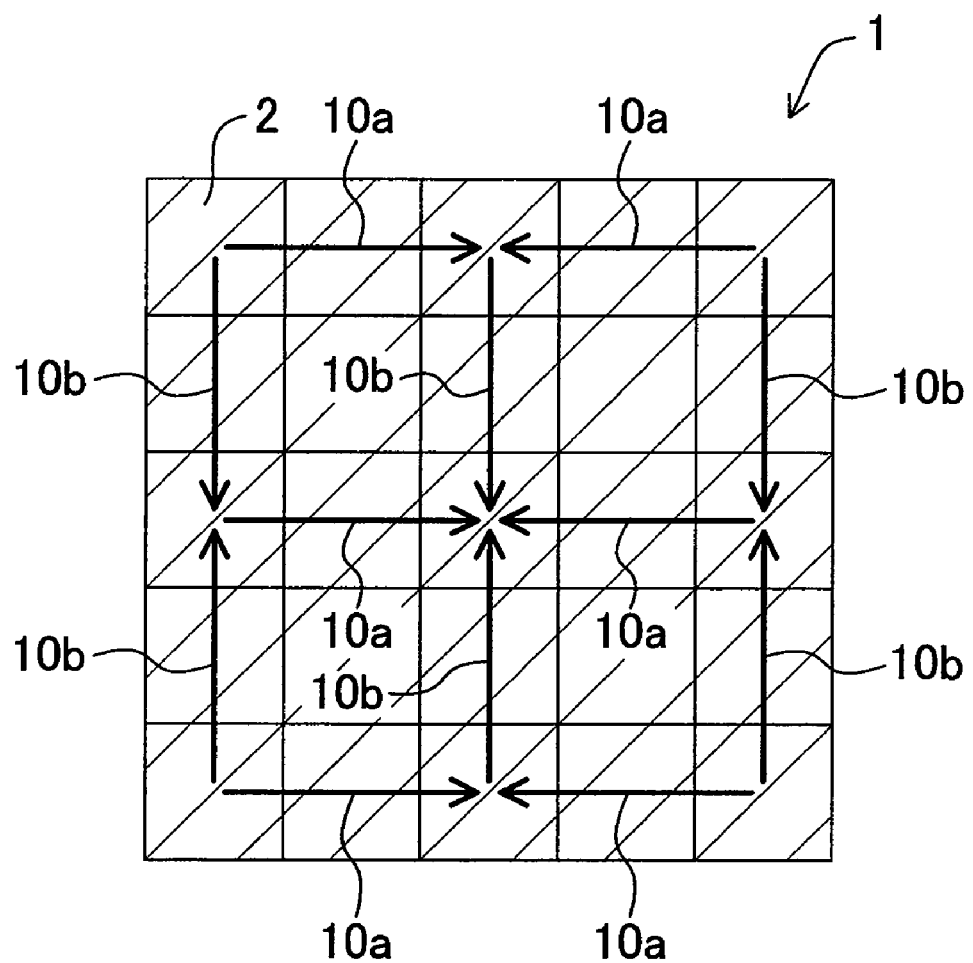
FIG. 1 is a plan view showing an imaging area of a solid-state imaging device according to a first embodiment of the present invention.

FIG. 1 is a plan view showing an imaging area of the solid-state imaging device according to the first embodiment of the present invention.

As shown in FIG. 1, the solid-state imaging device according to the first embodiment of the present invention includes an imaging area (pixel section) 1 where a plurality of unit pixel cells 2 are arranged in a matrix pattern (in the horizontal direction 10a and in the vertical direction 10b) on the semiconductor substrate, the unit pixel cells 2 each including a light-receiving section such as a photodiode for photoelectrically converting the incident light, wherein the charge stored in the light-receiving section is photoelectrically converted to an electric signal, which is detected by a signal detection circuit. The arrows 10a and 10b are shown in FIG. 1 to indicate that "the shifting from the peripheral portion of the imaging area toward the central portion thereof" as used herein and in the appended claims means shifting from the peripheral portion of the imaging area toward the central portion thereof either in the horizontal direction 10a or in the vertical direction 10b or both in the horizontal direction 10a and in the vertical direction 10b.

—Exemplary Circuit Configuration of Unit Pixel Cell—

Figure 2:
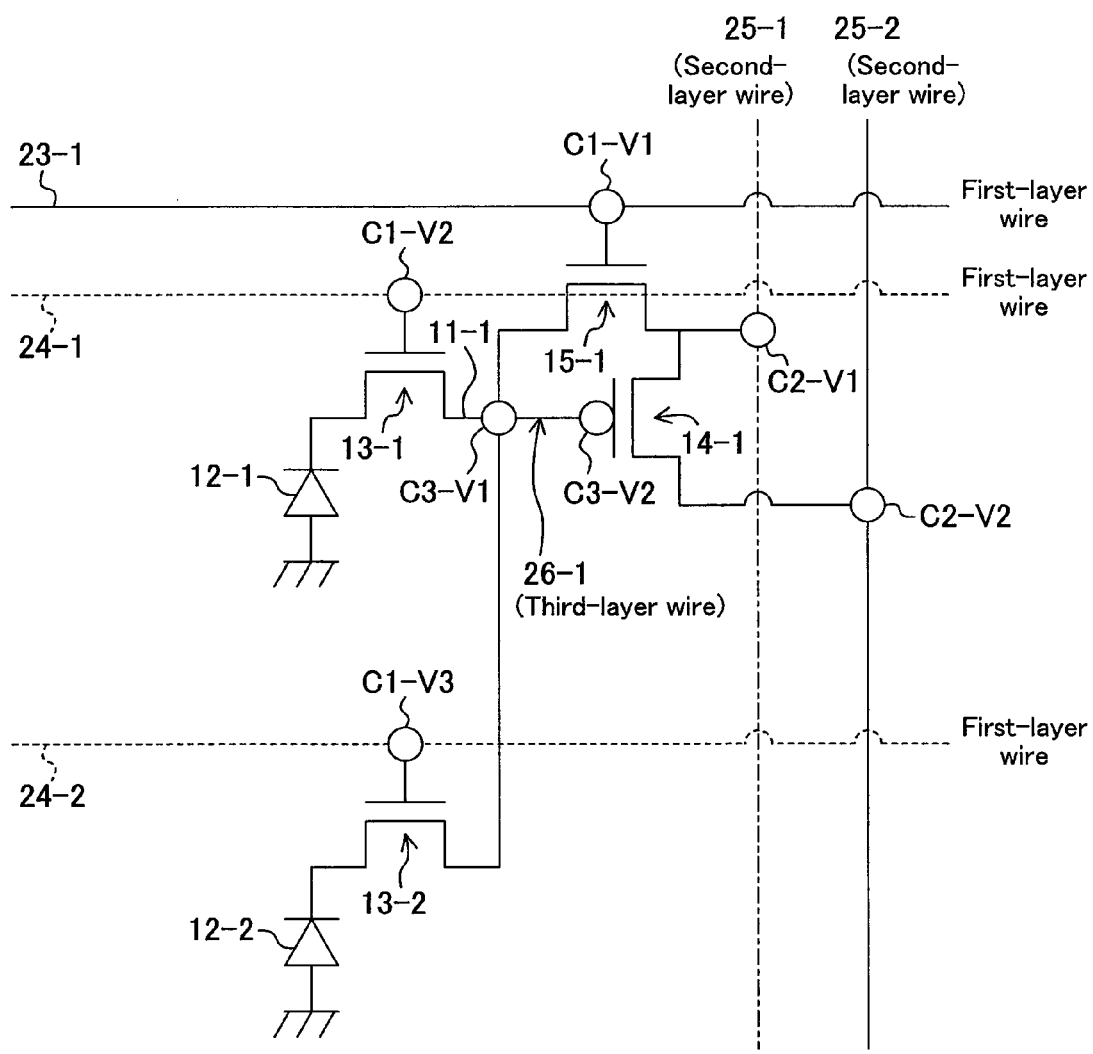
FIG. 2 is a circuit diagram showing an example of a unit pixel of a solid-state imaging device according to the first embodiment of the present invention.

FIG. 2 is a schematic circuit diagram showing an example of a unit pixel cell in the imaging area 1 of the solid-state imaging device according to the first embodiment of the present invention, wherein the unit pixel cell has a 2-pixels-per-cell structure where two photodiodes share one charge storing section.

As shown in FIG. 2, a unit pixel cell of the present embodiment includes photodiodes 12-1 and 12-2 being photoelectric conversion elements, charge transfer transistors 13-1 and 13-2, an amplifier transistor 14-1, and a reset transistor 15-1 for erasing the charge.

The photoelectric conversion area is formed by the photodiodes 12-1 and 12-2, and the signal detection circuit is formed by the amplifier transistor 14-1 and the reset transistor 15-1. The photodiodes 12-1 and 12-2 are the source of the charge transfer transistors 13-1 and 13-2, with the gate electrode of the charge transfer transistors 13-1 and 13-2 being formed between the drain and the source thereof. The amplifier transistor 14-1 has a structure where the source and the drain are formed at opposite ends of the gate electrode thereof. The drain of the amplifier transistor 14-1 and the drain of the reset transistor 15-1 are connected to a power supply voltage line (drain voltage input line) 25-1. A vertical signal line (signal read-out line) 25-2 is connected to the source of the amplifier transistor 14-1. A plurality of the unit pixel cells 2 each having such a configuration are arranged in a matrix pattern to thereby form the imaging area 1 shown in FIG. 1.

—Configuration and Arrangement of Wiring Layers and Contacts in Central Pixel—

FIGS. 3A and 3B to FIGS. 5A and 5B are plan views each showing the arrangement of primary elements of a central pixel in the central portion of the imaging area 1 of the solid-state imaging device according to the first embodiment of the present invention.

Figure 3A:
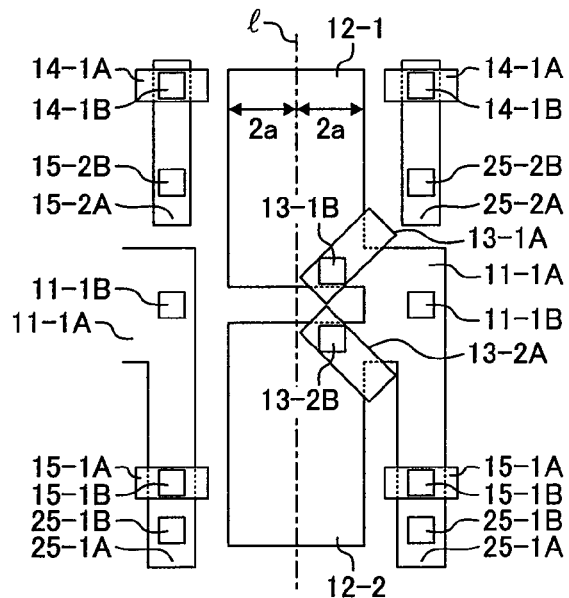
FIG. 3A is a plan view showing the arrangement of the substrate surface, the gate electrodes and the substrate contacts of the solid-state imaging device according to the first embodiment of the present invention.
Figure 3B:
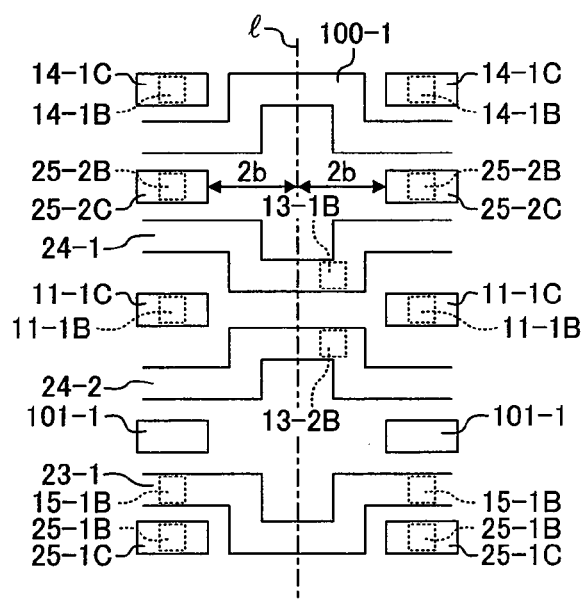
FIG. 3B is a plan view showing the arrangement of the substrate contacts and the first-layer metal wires of the solid-state imaging device according to the first embodiment of the present invention.
Figure 4A:
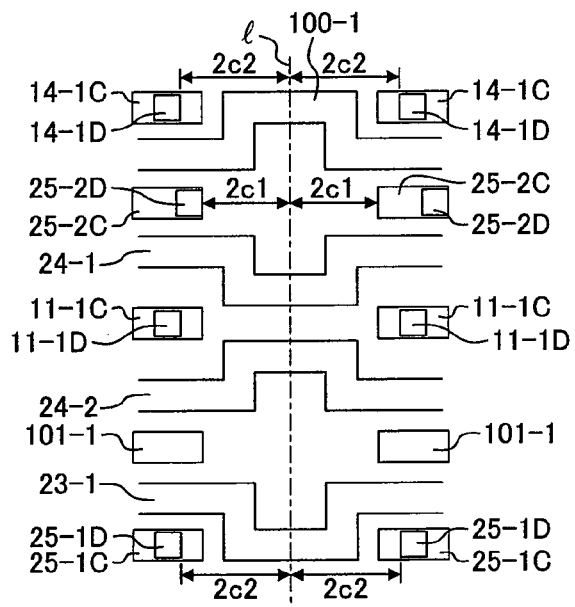
FIG. 4A is a plan view showing the arrangement of the first-layer metal wires and the first-layer contacts of the solid-state imaging device according to the first embodiment of the present invention.
Figure 4B:
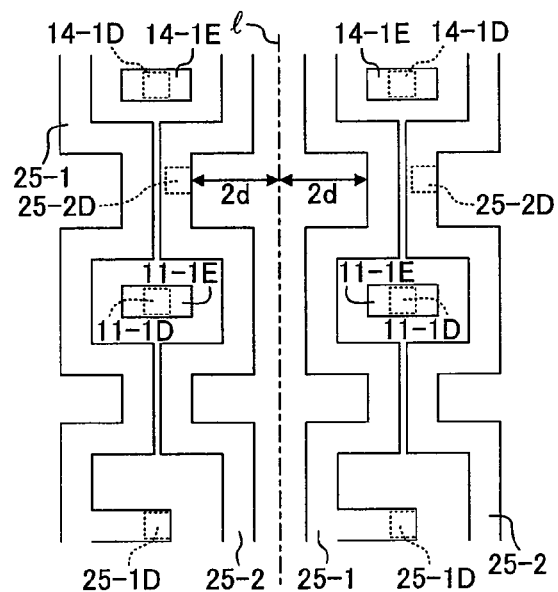
FIG. 4B is a plan view showing the arrangement of the first-layer contacts and the second-layer metal wires of the solid-state imaging device according to the first embodiment of the present invention.
Figure 5A:
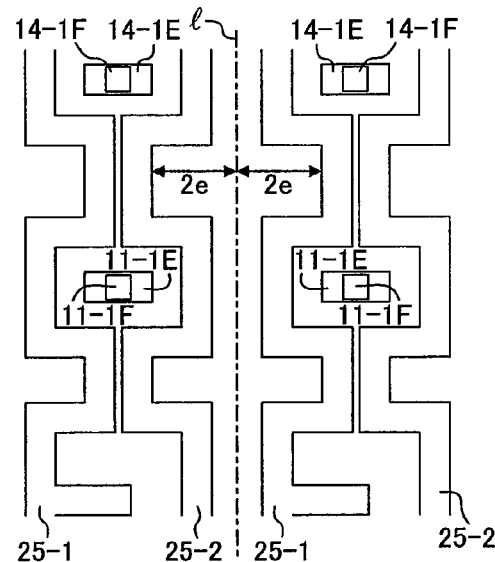
FIG. 5A is a plan view showing the arrangement of the second-layer metal wires and the second-layer contacts of the solid-state imaging device according to the first embodiment of the present invention.
Figure 5B:
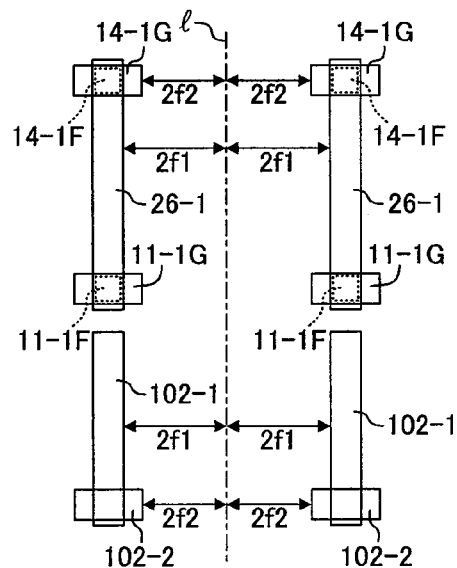
FIG. 5B is a plan view showing the arrangement of the second-layer contacts and the third-layer metal wires of the solid-state imaging device according to the first embodiment of the present invention.

Specifically, FIG. 3A shows the arrangement of the substrate surface, the gate electrodes, and the bottom-layer contacts, and FIG. 3B shows the arrangement of the bottom-layer contacts, and the first-layer metal wire (the first wiring layer). FIG. 4A shows the arrangement of the first-layer metal wire and the first-layer contacts (the first contacts), and FIG. 4B shows the arrangement of the first-layer contacts and the second-layer metal wire (the second wiring layer). FIG. 5A shows the arrangement of the second-layer metal wire and the second-layer contacts (the second contacts), and FIG. 5B shows the arrangement of the second-layer contacts and the third-layer metal wire (the third wiring layer). A "substrate contact" as used herein refers to a bottom-layer contact that connects between the active region of the semiconductor substrate and the first-layer metal wire, a "first-layer contact" refers to a contact that connects between the first-layer metal wire and the second-layer metal wire, and a "second-layer contact" refers to a contact that connects between the second-layer metal wire and the third-layer metal wire.

The arrangement of the substrate surface, the gate electrodes and the bottom-layer contacts shown in FIG. 3A includes a charge storing section 11-1A, the photodiodes 12-1 and 12-2, transfer gates 13-1A and 13-2A, a gate electrode 14-1A of the amplifier transistor, a gate electrode 15-1A of the reset transistor, a drain 25-1A of the reset transistor, and a source 25-2A of the amplifier transistor. As the bottom-layer contacts, the arrangement includes a bottom-layer contact 11-1B of the charge storing section 11-1A, bottom-layer contacts 13-1B and 13-2B of the transfer gates 13-1A and 13-2A, a bottom-layer contact 14-1B of the gate electrode 14-1A of the amplifier transistor, a bottom-layer contact 15-1B of the gate electrode 15-1A of the reset transistor, a bottom-layer contact 25-1B of the drain 25-1A of the reset transistor, and a bottom-layer contact 25-2B of the source 25-2A of the amplifier transistor. In the figures, the inside of each closed curve delimited by a solid line is an active region, and the other portions are, for example, device isolation regions such as STI (Shallow Trench Isolation) or LOCOS. The transfer gates 13-1A and 13-2A are made of a polysilicon or a polymetal (tungsten silicide/polysilicon). Where a polysilicon is used, it is preferred that a silicide such as a cobalt silicide, a titanium silicide or a nickel silicide is formed below the bottom-layer contacts 13-1B and 13-2B in order to reduce the contact resistance. The straight line 1 denotes the center line that equally divides the photodiodes 12-1 and 12-2 by the distance 2a.

Next, the arrangement of the bottom-layer contacts and the first-layer metal wire shown in FIG. 3B includes a wire-connecting contact (forming the first-layer metal wire) 11-1C of the charge storing section 11-1A that connects to the bottom-layer contact 11-1B of the charge storing section 11-1A, transfer gate voltage input wires (forming the first-layer metal wire) 24-1 and 24-2 that connect to the bottom-layer contacts 13-1B and 13-2B of the transfer gates 13-1A and 13-2A, a wire-connecting wiring section (forming the first-layer metal wire) 14-1C of the gate electrode 14-1A of the amplifier transistor that connects to the bottom-layer contact 14-1B of the gate electrode 14-1A of the amplifier transistor, a reset voltage input wire (forming the first-layer metal wire) 23-1 that connects to the bottom-layer contact 15-1B of the gate electrode 15-1A of the reset transistor, a wire-connecting wiring section (forming the first-layer metal wire) 25-1C of the drain 25-1A of the reset transistor that connects to the bottom-layer contact 25-1B of the drain 25-1A of the reset transistor, and a wire-connecting wiring section (forming the first-layer metal wire) 25-2C of the source 25-2A of the amplifier transistor that connects to the bottom-layer contact 25-2B of the source 25-2A of the amplifier transistor. As shown in the figure, dummy patterns 100-1 and 101-1 (forming the first-layer metal wire) are also formed. In the figure, the distance $2b$ denotes an equal distance from the wire-connecting wiring section 25-2C of the source 25-2A of the amplifier transistor to the straight line 1.

Next, the arrangement of the first-layer metal wire and the first-layer contacts shown in FIG. 4A includes a first-layer contact 11-1D of the charge storing section 11-1A that connects to the wire-connecting contact 11-1C of the charge storing section 11-1A, a first-layer contact 14-1D of the gate electrode 14-1A of the amplifier transistor that connects to the wire-connecting wiring section 14-1C of the gate electrode 14-1A of the amplifier transistor, a first-layer contact 25-1D of the drain 25-1A of the reset transistor that connects to the wire-connecting wiring section 25-1C of the drain 25-1A of the reset transistor, and a first-layer contact 25-2D of the source 25-2A of the amplifier transistor that connects to the wire-connecting wiring section 25-2C of the source 25-2A of the amplifier transistor. In the figure, the distance $2c1$ denotes an equal distance (also equal to the distance $2b$) from the wire-connecting wiring section 25-2C of the source 25-2A of the amplifier transistor to the straight line 1, and the distance $2c2$ denotes an equal distance from the first-layer contact 14-1D of the gate electrode 14-1A of the amplifier transistor to the straight line 1.

Next, the arrangement of the first-layer contacts and the second-layer metal wire shown in FIG. 4B includes a wire-connecting contact (forming the second-layer metal wire) 11-1E of the charge storing section 11-1A that connects to the first-layer contact 11-1D of the charge storing section 11-1A, a wire-connecting wiring section (forming the second-layer metal wire) 14-1E of the gate electrode 14-1A of the amplifier transistor that connects to the first-layer contact 14-1D of the gate electrode 14-1A of the amplifier transistor, a drain voltage input line (forming the second-layer metal wire) 25-1 that connects to the first-layer contact 25-1D of the drain 25-1A of the reset transistor, and the signal read-out line (forming the second-layer metal wire) 25-2 that connects to the first-layer contact 25-2D of the source 25-2A of the amplifier transistor. In the figure, the distance $2d$ denotes an equal distance from the signal read-out line 25-2 to the straight line 1.

Next, the arrangement of the second-layer metal wire and the second-layer contacts shown in FIG. 5A includes a second-layer contact 11-1F of the charge storing section 11-1A that connects to the wire-connecting contact 11-1E of the charge storing section 11-1A, and a second-layer contact 14-1F of the charge storing section 11-1A that connects to the wire-connecting wiring section 14-1E of the gate electrode 14-1A of the amplifier transistor. In the figure, the distance $2e$ denotes an equal distance (also equal to the distance $2d$) from the signal read-out line 25-2 to the straight line 1.

Next, the arrangement of the second-layer contacts and the third-layer metal wire shown in FIG. 5B includes a wire 26-1 (forming the third-layer metal wire), a connection wire pad (forming the third-layer metal wire) 11-1G that connects between the charge storing section 11-1A and the wire 26-1 via the second-layer contact 11-1F of the charge storing section 11-1A, and a connection wire pad (forming the third-layer metal wire) 14-1G that connects between the gate electrode 14-1A of the amplifier transistor and the wire 26-1 via the second-layer contact 14-1F of the charge storing section 11-1A. As shown in the figure, dummy patterns 102-1 and 102-2 (forming the third-layer metal wire) are also formed. The dummy pattern 102-2 forming a part of the third-layer metal wire is not electrically connected to other wires. Significant variations in the wiring pattern around each photodiode lead to different light condensing rates between pixels, thus causing variations in the sensitivity. Therefore, it is preferred that the wiring pattern for each pixel is made as similar to others as possible. Variations in the sensitivity can be suppressed by the formation of the dummy pattern 102-2. The dummy pattern 101-1 forming a part of the first-layer metal wire is provided for the same reason. In the figure, the distance $2f1$ denotes an equal distance from the wire 26-1 to the straight line 1, and the distance $2f2$ denotes an equal distance from the connection wire pad 14-1G or the dummy pattern 102-2 to the straight line 1.

The correspondence between the circuit diagram of a unit pixel cell shown in FIG. 2 and the arrangement of the wiring layer and the contacts shown in FIGS. 3A and 3B to FIGS. 5A and 5B will now be described.

As shown in FIGS. 3A and 3B, the transfer gates 13-1A and 13-2A for transferring the charge stored in the photodiodes 12-1 and 12-2 to the charge storing section 11-1A are connected to the transfer gate voltage input wires 24-1 and 24-2, being the first-layer metal wires, via the bottom-layer contacts 13-1B and 13-2B for the transfer gates 13-1A and 13-2A, corresponding respectively to C1-V2 and C1-V3 in FIG. 2. Voltages to the transfer gates 13-1A and 13-2A are applied through the transfer gate voltage input wires 24-1 and 24-2, being the power supply voltage lines.

Provided in the vicinity of the photodiodes 12-1 and 12-2 via the device isolation region are the gate electrode 15-1A and the drain 25-1A of the reset transistor serving to turn ON the transfer gates 13-1A and 13-2A and remove the charge of the charge storing section 11-1A before transferring a charge to the charge storing section 11-1A. The gate electrode 15-1A of the reset transistor is connected to the reset voltage input wire 23-1 via the bottom-layer contact 15-1B of the gate electrode 15-1A of the reset transistor, corresponding to C1-V1 in FIG. 2. The voltage to the gate electrode 15-1A of the reset transistor is applied through the reset voltage input wire 23-1.

As shown in FIGS. 3A and 3B to FIGS. 5A and 5B, the amplifier transistor, including the source 25-2A, the gate electrode 14-1A and the drain 25-1A, serves to amplify the charge stored in the charge storing section 11-1A to output a signal from the source 25-2A of the amplifier transistor to the signal read-out line 25-2. The gate electrode 14-1A of the amplifier transistor is connected to the connection wire pad 14-1G via the bottom-layer contact 14-1B of the gate electrode 14-1A of the amplifier transistor, the wire-connecting wiring section 14-1C of the gate electrode 14-1A of the amplifier transistor, the first-layer contact 14-1D of the gate electrode 14-1A of the amplifier transistor, the wire-connecting wiring section 14-1E of the gate electrode 14-1A of the amplifier transistor, and the second-layer contact 14-1F of the gate electrode 14-1A of the amplifier transistor, whereby the charge storing section 11-1A and the connection wire 26-1 of the amplification gate are connected to each other, corresponding to C3-V2 in FIG. 2. The charge storing section 11-1A and the connection wire 26-1 of the amplification gate are connected to each other via the bottom-layer contact 11-1B of the charge storing section 11-1A, the wire-connecting contact 11-1C of the charge storing section 11-1A, the first-layer contact 11-1D of the charge storing section 11-1A, the second-layer wire-connecting contact 11-1E of the charge storing section 11-1A, and the second-layer contact 11-1F of the charge storing section 11-1A, corresponding to C3-V1 in FIG. 2. Thus, the charge storing section 11-1A and the gate electrode 14-1A of the amplifier transistor are electrically connected to each other via a plurality of wires and contacts.

The drain 25-1A of the reset transistor is shared between the reset transistor including the charge storing section 11-1A, the gate electrode 15-1A of the reset transistor and the drain 25-1A of the reset transistor, and the amplifier transistor including the source 25-2A of the amplifier transistor, the gate electrode 14-1A of the amplifier transistor and the drain 25-1A of the reset transistor. The drain 25-1A of the reset transistor is connected to the drain voltage input line 25-1 via the bottom-layer contact 25-1B of the drain 25-1A of the reset transistor, the wire-connecting wiring section 25-1C of the drain 25-1A of the reset transistor, and the first-layer contact 25-1D of the drain 25-1A of the reset transistor, corresponding to C2-V1 in FIG. 2.

The signal to the gate electrode 14-1A of the amplifier transistor is amplified and output as the potential of the source 25-2A of the amplifier transistor. The source 25-2A of the amplifier transistor is connected to the signal read-out line 25-2 via the bottom-layer contact 25-2B of the amplifier transistor, the wire-connecting wiring section 25-2C of the source of the amplifier transistor, and the first-layer contact 25-2D of the source of the amplifier transistor, corresponding to C2-V2 in FIG. 2.

—Configuration and Arrangement of Wiring Layers and Contacts in Peripheral Pixel—

First, in a pixel (peripheral pixel) in a peripheral portion of the imaging area 1 of the solid-state imaging device according to the first embodiment of the present invention, the substrate surface, the gate electrodes, the bottom-layer contacts, the first-layer contacts, the second-layer contacts, the first-layer metal wires, the second-layer metal wires and the third-layer metal wires are configured similar to those in a central pixel as described above with reference to FIGS. 3A and 3B to FIGS. 5A and 5B and correspond similarly to the circuit diagram shown in FIG. 2. Therefore, these elements will not be further described below.

A characteristic of the solid-state imaging device according to the first embodiment of the present invention is the arrangement of the wiring layers and the contacts in a peripheral pixel. Specifically, in the present embodiment, the arrangement of the first-layer metal wires, the first-layer contacts, the second-layer metal wires, the second-layer contacts and the third-layer metal wires is shifted from that in a central pixel. The shifted arrangement will now be described in detail with respect to the arrangement in a central pixel.

FIG. 6A shows the arrangement of the first-layer metal wires and the first-layer contacts of the solid-state imaging device according to the first embodiment of the present invention, wherein the upper portion of the figure is a plan view showing the arrangement with no wire shifting in a central pixel, and the lower portion thereof is a plan view showing the arrangement with wire shifting in a peripheral pixel; and FIG. 6B shows the arrangement of the first-layer contacts and the second-layer metal wires of the solid-state imaging device according to the first embodiment of the present invention, wherein the upper portion of the figure is a plan view showing the arrangement with no wire shifting in a central pixel, and the lower portion thereof is a plan view showing the arrangement with wire shifting in a peripheral pixel.

As shown in FIG. 6A, in the arrangement of the first-layer metal wires in a peripheral pixel, the wire-connecting wiring section 25-2C of the source 25-2A of the amplifier transistor and the dummy pattern 101-1 are shifted. Specifically, as can be seen from a comparison between the upper and lower portions of FIG. 6A, the arrangement of the first-layer metal wires (25-2C, 101-1) in a peripheral pixel is shifted from that in a central pixel by the shift amount s2 (where 0<s2) in the horizontal direction 10a (see FIG. 1) from the peripheral portion of the imaging area 1 toward the central portion thereof.

In the arrangement of the first-layer contacts in a peripheral pixel, the first-layer contact 14-1D of the gate electrode 14-1A of the amplifier transistor, the first-layer contact 25-2D of the source 25-2A of the amplifier transistor, the first-layer contact 11-1D of the charge storing section 11-1A and the first-layer contact 25-1D of the drain 25-1A of the reset transistor are shifted. Specifically, as can be seen from a comparison between the upper and lower portions of FIG. 6A, the arrangement of the first-layer contacts (14-1D, 11-1D, 25-1D, 25-2D) in a peripheral pixel is shifted from that in a central pixel by the shift amount s1 (where 0<s1) in the horizontal direction 10a (see FIG. 1) from the peripheral portion of the imaging area 1 toward the central portion thereof. While the illustrated example is a case where the shift amount s1 and the shift amount s2 are an equal shift amount s (thus, the distance between the straight line 1 and the straight line 11 is s, and the distances 2c1 and 2c2 become equal to each other with the straight line 11 lying in the middle therebetween in a peripheral pixel), the shift amount s1 may be larger than the shift amount s2 as long as the connection with the first-layer metal wires is ensured. The dummy pattern 101-1 is also shifted, as are the shifted first-layer contacts and the shifted first-layer metal wires. Thus, it is possible to reduce the difference in the light condensing rate between pixels.

Not all but only some of the elements of the first-layer metal wires are shifted as described above for the following reason. For example, where s denotes the shift amount of the first-layer metal wires, t denotes the shift amount of the second-layer metal wires, and u denotes the shift amount of the third-layer metal wires, a preferred arrangement is typically an arrangement that satisfies u>t>s, in view of the fact that light that is condensed through the on-chip microlens and the inner-layer (condensing) lens to enter the photodiode has a greater spread in upper layers. In order to prevent the disconnection of the contacts between metal wires, it is sufficient, in the first-layer metal wires where the spread of light is small and the interception of light is small, that only some of the elements are shifted, but the arrangement is restricted by other adjacent metal wires (e.g., 100-1, 101-1, 23-1) in the first layer.

As shown in FIG. 6B, in the arrangement of the second-layer metal wires with respect to the first-layer contacts in a peripheral pixel, all the elements of the second-layer metal wires are shifted so as to correspond to the shifted arrangement of the first-layer contacts. Specifically, as is apparent from a comparison between the upper and lower portions of FIG. 6B, the arrangement of the second-layer metal wires (14-1E, 11-1E, 25-1, 25-2) in a peripheral pixel is shifted from that in a central pixel by the shift amount t2 (where 0<t2) in the horizontal direction 10a (see FIG. 1) from the peripheral portion of the imaging area 1 toward the central portion thereof (thus, the distance between the straight line 1 and the straight line 11 is t2, and the distances 2d in a peripheral pixel are an equal distance with the straight line 11 lying in the middle therebetween). While the illustrated example is a case where the shift amount t2 and the shift amount s1 are equal to each other (thus, the shift amount s2 is also an equal amount), the shift amount t2 may be larger than the shift amount s1 as long as the connection with the first-layer contacts is ensured.

Then, even if all the elements of the second-layer metal wires are shifted by the same distance in the same direction, it is possible to suppress the interception of incident light and to prevent the sensitivity deterioration while ensuring the connection between the first-layer contacts, the first-layer metal wires and the bottom-layer contacts.

Next, FIG. 7A shows the arrangement of the second-layer metal wires and the second-layer contacts of the solid-state imaging device according to the first embodiment of the present invention, wherein the upper portion of the figure is a plan view showing the arrangement with no wire shifting in a central pixel, and the lower portion thereof is a plan view showing the arrangement with wire shifting in a peripheral pixel; and FIG. 7B shows the arrangement of the second-layer contacts and the third-layer metal wires of the solid-state imaging device according to the first embodiment of the present invention, wherein the upper portion of the figure is a plan view showing the arrangement with no wire shifting in a central pixel, and the lower portion thereof is a plan view showing the arrangement with wire shifting in a peripheral pixel.

As shown in FIG. 7A, in the arrangement of the second-layer contacts with respect to the second-layer metal wires in a peripheral pixel, all the second-layer contacts are shifted so as to correspond to the shifted arrangement of the second-layer metal wires. Specifically, as is apparent from a comparison between the upper and lower portions of FIG. 7A, the arrangement of the second-layer contacts (14-1F, 11-1F) in a peripheral pixel is shifted from the arrangement of the second-layer contacts (14-1E, 11-1E, 25-1, 25-2) in a central pixel by the shift amount t2 (where 0<t2) in the horizontal direction 10a (see FIG. 1) from the peripheral portion of the imaging area 1 toward the central portion thereof (thus, the distance between the straight line 1 and the straight line 11 is t1, and the distances 2e in a peripheral pixel are an equal distance with the straight line 11 lying in the middle therebetween). While the illustrated example is a case where the shift amount t1 and the shift amount t2 are equal to each other (thus, the shift amount s1 and the shift amount s2 are also an equal amount), the shift amount t1 may be larger than the shift amount t2 as long as the connection with the second-layer metal wires is ensured.

As shown in FIG. 7B, in the arrangement of the third-layer metal wires with respect to the second-layer contacts in a peripheral pixel, all the elements of the third-layer metal wires are shifted by two different shift amounts. Specifically, as is apparent from a comparison between the upper and lower portions of FIG. 7B, the arrangement of some of the third-layer metal wires (14-1G, 11-1G, 102-2) in a peripheral pixel is shifted from that in a central pixel by the shift amount u1 (where 0<u1) in the horizontal direction 10a (see FIG. 1) from the peripheral portion of the imaging area 1 toward the central portion thereof (thus, the distance between the straight line 1 and the straight line 11 is u1, and the distances 2f2 in a peripheral pixel are an equal distance with the straight line 11 lying in the middle therebetween). While the illustrated example is a case where the shift amount u1 and the shift amount t2 are equal to each other (thus, the shift amount t1, the shift amount s1 and the shift amount s2 are also an equal amount), the shift amount u1 may be larger than the shift amount t2 as long as the connection with the second-layer contacts is ensured. The arrangement of some others of the third-layer metal wires (26-1, 102-1) in a peripheral pixel is shifted from that in a central pixel by the shift amount u2 (where 0<u2), which is larger than the shift amount u1, in the horizontal direction 10a (see FIG. 1) from the peripheral portion of the imaging area 1 toward the central portion thereof (thus, the distance between the straight line 1 and the straight line 12 is u2, and the distances 2f1 in a peripheral pixel are an equal distance with the straight line 12 lying in the middle therebetween).

This is for arranging some of the third-layer metal wires (14-1G, 11-1G), for which the shift amount is u1, so as to ensure the electrical connection thereof with the second-layer contacts (14-1F, 11-1F), wherein the shift is by the same amount as the shift amount t1 of the second-layer metal wires. Some of the third-layer metal wires (26-1, 102-1), for which the shift amount is u2, are shifted by a greater shift amount than the shift amount u1. This is for significantly shifting some of the third-layer metal wires (26-1, 102-1), whose arrangement is not restricted by the electrical connection with the second-layer contacts, in view of the fact that light that is incident from an oblique direction is farther away from the center of the photodiode as it is farther away from the substrate surface and the fact that the interception of light is greater in more peripheral pixels.

Then, it is possible to suppress the interception of incident light and to prevent the sensitivity deterioration while ensuring the connection between the second-layer metal wires, the second-layer contacts and the third-layer metal wires.

Figure 8A:
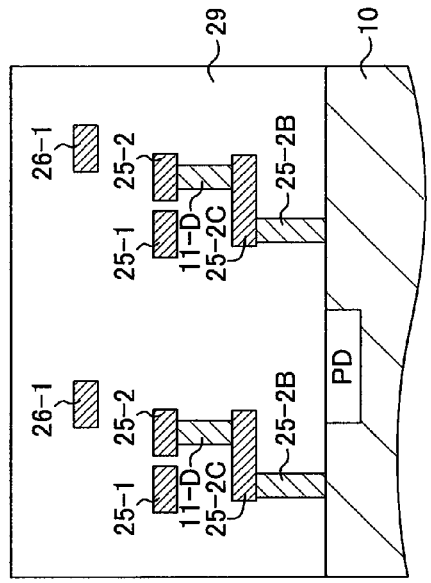
Figure 8B:
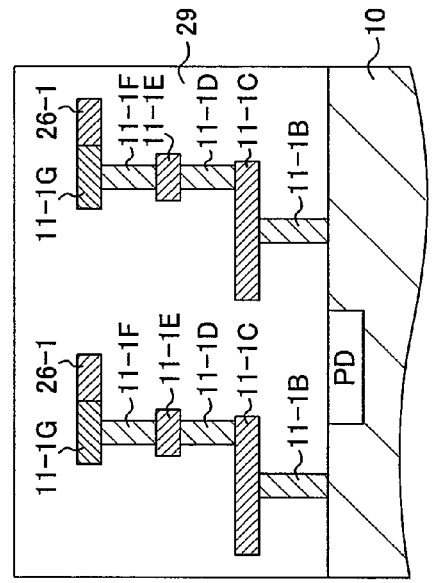
Figure 8C:
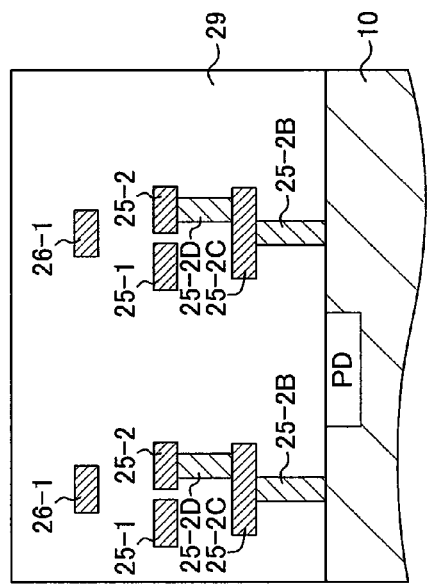
Figure 8D:
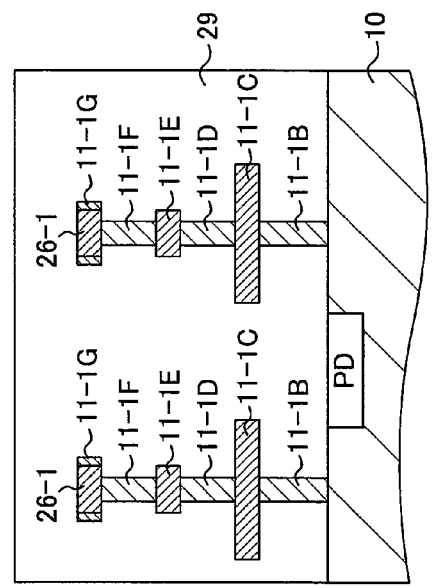

FIGS. 8A and 8B are cross-sectional views showing a central pixel of the solid-state imaging device according to the first embodiment of the present invention, wherein FIG. 8A shows a cross section of up to the substrate taken along line VIIIa-VIIIa in FIGS. 6A and 6B and FIGS. 7A and 7B, and FIG. 8B shows a cross section of up to the substrate taken along line VIIIb-VIIIb in FIGS. 6A and 6B and FIGS. 7A and 7B; and FIGS. 8C and 8D are cross-sectional views showing a peripheral pixel of the solid-state imaging device according to the first embodiment of the present invention, wherein FIG. 8C shows a cross section of up to the substrate taken along line VIIIc-VIIIc in FIGS. 6A and 6B and FIGS. 7A and 7B, and FIG. 8D shows a cross section of up to the substrate taken along line VIIId-VIIId in FIGS. 6A and 6B and FIGS. 7A and 7B.

FIGS. 8A and 8C correspond to each other, being a cross-sectional view of a central pixel and a cross-sectional view of a peripheral pixel, respectively, wherein the bottom-layer contacts (25-2B) are connected to some of the second-layer metal wires (25-2) via some of the first-layer metal wires (25-2C) and the first-layer contacts (25-2D) in an interlayer insulating layer 29 on a semiconductor substrate 10. Therefore, in a peripheral pixel, the bottom-layer contacts (25-2B), some of the first-layer metal wires (25-2C), the first-layer contacts (25-2D) and some of the second-layer metal wires (25-2) are shifted by a shift amount shown in FIGS. 6A and 6B and FIG. 7A (in the same direction and by the same amount in the present embodiment), as shown in FIG. 8C, in order to maintain these electrical connections. In the interlayer insulating layer 29 on the semiconductor substrate 10, some of the third-layer metal wires (26-1) are shifted by a shift amount shown in FIG. 7B (a shift amount greater than the above shift amount) because there is no restriction on the electrical connections.

FIGS. 8B and 8D correspond to each other, being a cross-sectional view of a central pixel and a cross-sectional view of a peripheral pixel, respectively, wherein the bottom-layer contacts (11-1B) are connected to some of the third-layer metal wires (11-1G) via some of the first-layer metal wires (11-1C), the first-layer contacts (11-1D), some of the second-layer metal wires (11-1E) and the second-layer contacts (11-1F) in the interlayer insulating layer 29 on the semiconductor substrate 10. Therefore, in a peripheral pixel, the bottom-layer contacts (11-1B), some of the first-layer metal wires (11-1C), the first-layer contacts (11-1D), some of the second-layer metal wires (11-1E), the second-layer contacts (11-1F) and some of the third-layer metal wires (11-1G) are shifted by a shift amount shown in FIGS. 6A and 6B and FIGS. 7A and 7B (in the same direction and by the same amount in the present embodiment), as shown in FIG. 8D, in order to maintain these electrical connections. In the interlayer insulating layer 29 on the semiconductor substrate 10, some of the third-layer metal wires (26-1) are shifted by a shift amount shown in FIG. 7B (a shift amount greater than the above shift amount) because there is no restriction on the electrical connections. Then, it is possible to reduce the interception of incident light by metal wiring layers in peripheral pixels, thus improving the sensitivity.

FIGS. 9A and 9B are cross-sectional views showing a peripheral pixel of the solid-state imaging device according to the first embodiment of the present invention, wherein FIG. 9A is a cross-sectional view, corresponding to FIG. 8A, showing an arrangement with no wire shifting, and FIG. 9B is a cross-sectional view, corresponding to FIG. 8C, showing an arrangement with wire shifting.

In FIGS. 9A and 9B, the arrangement includes an on-chip microlens 30 on the interlayer insulating layer 29 with an inner-layer (condensing) lens 31 and an organic insulating layer 32 being interposed therebetween, wherein the inner-layer lens 31 and the on-chip microlens 30 are shifted. With the arrangement with no wire shifting shown in FIG. 9A, the incident light is intercepted (reflected) by a metal wiring layer (e.g., 26-1), significantly deteriorating the sensitivity. With the arrangement with wire shifting shown in FIG. 9B, the interception of the incident light by the metal wiring layer is greatly reduced, significantly improving the sensitivity.

In the present embodiment, the first- to third-layer metal wires may be, for example, aluminum wires, aluminum/copper wires, tungsten wires or copper wires.

In the present embodiment, the inner-layer (condensing) lens 31 may be formed by using, for example, an inorganic material such as a silicon nitride film or a silicon oxynitride film, an acrylic material, a fluorinated resin, or the like.

In the present embodiment, the on-chip microlens 30 may be formed by using, for example, an acrylic resin or a fluorinated resin.

While the present embodiment is directed to a case where the bottom-layer contacts (14-1B, 15-2B, 11-1B, 15-1B, 25-1B), being substrate contacts, are not shifted, they may be shifted. In such a case, it is sufficient that the shift amount r (r<0) is equal to or less than the shift amount s1 for a case where some of the first-layer metal wires are shifted, because there is little interception of incident light by metal wires near the bottom-layer contacts.

While the present embodiment is directed to a 2-pixels-per-cell arrangement as shown in FIG. 2, other arrangements may be employed for similar effects, including other multi-pixels-per-cell arrangements or a 1-pixel-per-cell arrangement.

Second Embodiment

A solid-state imaging device according to a second embodiment of the present invention will now be described.

The solid-state imaging device according to the second embodiment of the present invention has the structure of the solid-state imaging device of the first embodiment described above, i.e., a structure where the arrangement of metal wires and contacts in a peripheral pixel is shifted as described above with respect to that of a corresponding portion in a central pixel, wherein copper wires are used as the metal wires. Therefore, the following description will focus on the characteristic portion of the present embodiment, without repeating the description of what have already been described above in the first embodiment.

Figure 10A:
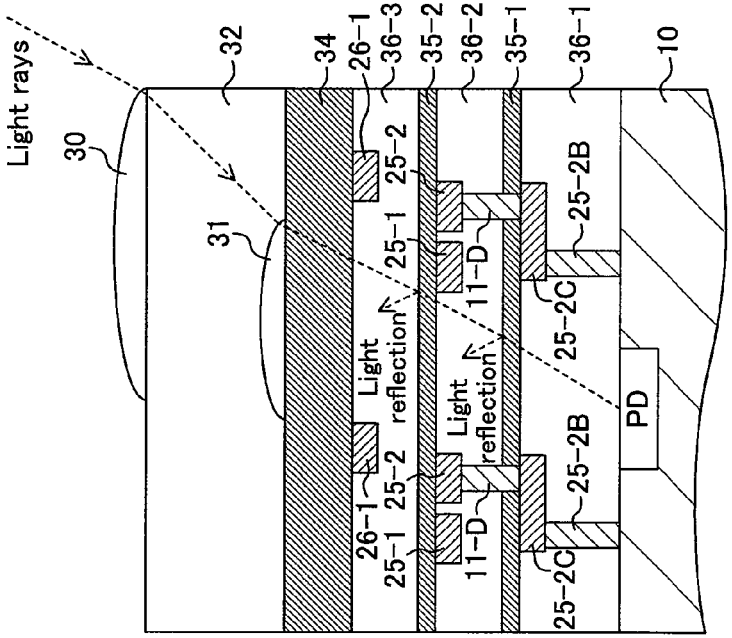
FIG. 10A is a cross-sectional view showing the path of incident light in an arrangement with no wire shifting in a central pixel of a solid-state imaging device according to a second embodiment of the present invention.
Figure 10B:
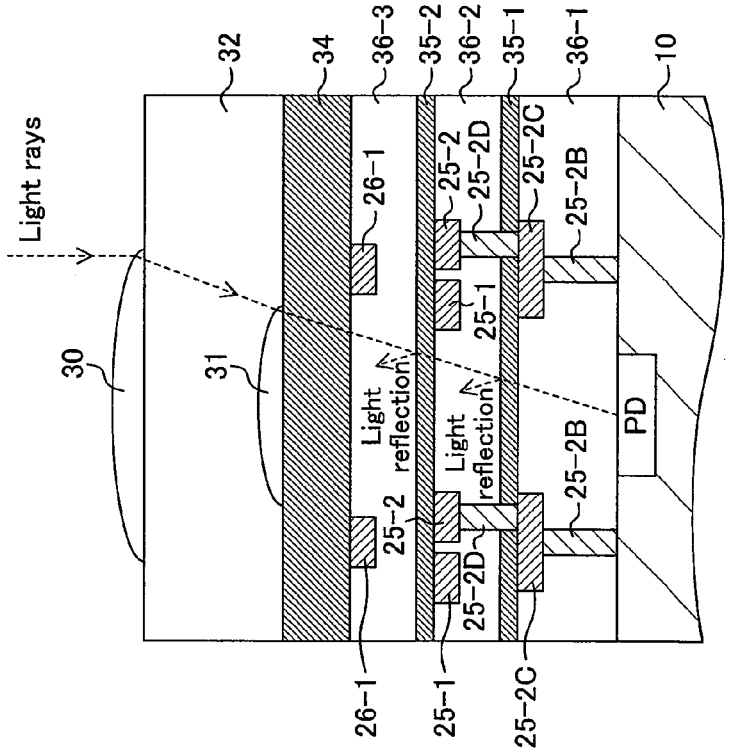
FIG. 10B is a cross-sectional view showing the path of incident light in an arrangement with wire shifting in a peripheral pixel.

FIG. 10A is a cross-sectional view showing the path of incident light in an arrangement with no wire shifting in a central pixel of a solid-state imaging device according to the second embodiment of the present invention, and FIG. 10B is a cross-sectional view showing the path of incident light in an arrangement with wire shifting in a peripheral pixel.

Referring to FIGS. 10A and 10B, the first-layer metal wires (25-2C), the second-layer metal wires (25-1, 25-2) and the third-layer metal wires (26-1) are copper wires. Therefore, in a case where a CMOS process is applied as it is to a CMOS sensor, a first wiring protection film 35-1, a second wiring protection film 35-2 and a third wiring protection film 34 are formed between a first interlayer insulating layer 36-1 and a second interlayer insulating layer 36-2, between the second interlayer insulating layer 36-2 and a third interlayer insulating layer 36-3 and between the third interlayer insulating layer 36-3 and the organic insulating layer 32, respectively, so as to cover the upper surfaces of the first-layer metal wires (25-2C), the second-layer metal wires (25-1, 25-2) and the third-layer metal wires (26-1), as is apparent from a comparison with FIGS. 9A and 9B discussed above.

While the first to third interlayer insulating films 36-1, 36-2 and 36-3 are normally silicon oxide films, BPSG (borophosphosilicate glass) films or FSG (fluorosilicate glass) films, the first to third wiring protection films 35-1, 35-2 and 34 are silicon nitride films (SiN film) or silicon oxynitride films (SION films). Since the refractive index of the first to third interlayer insulating films 36-1, 36-2 and 36-3 is normally significantly different from that of the first to third wiring protection films 35-1, 35-2 and 34, incident light is reflected at these interfaces, thus deteriorating the sensitivity (see FIGS. 10A and 10B). For example, where the first to third interlayer insulating films 36-1, 36-2 and 36-3 are silicon oxide films, the refractive index thereof is about 1.45, and where the first to third wiring protection films 35-1, 35-2 and 34 are silicon nitride films, the refractive index thereof is about 2.05, whereby incident light is reflected by these interfaces and is attenuated by about 20%, thus deteriorating the sensitivity.

Figure 11A:
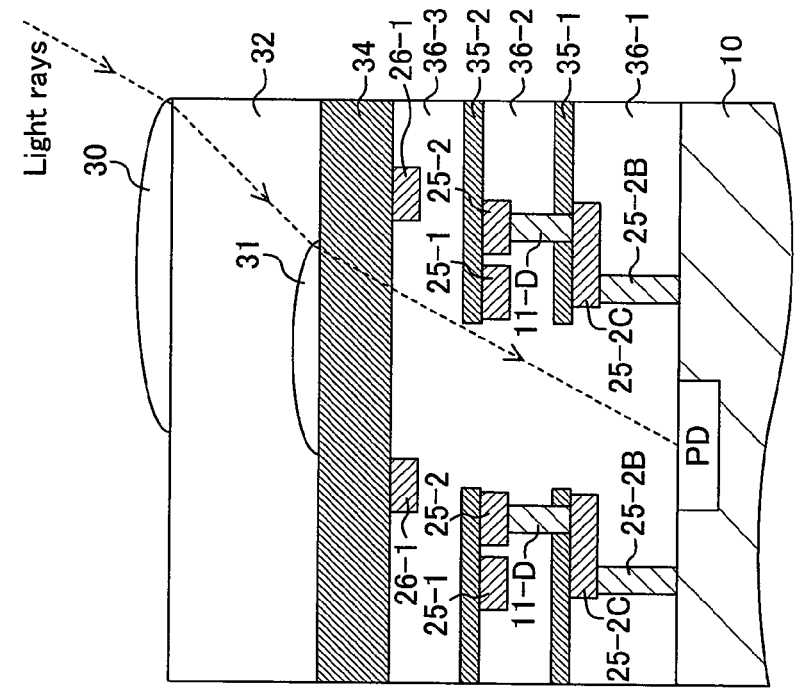
FIG. 11A is a cross-sectional view showing an arrangement with no wire shifting in a central pixel of the solid-state imaging device according to the second embodiment of the present invention.
Figure 11B:
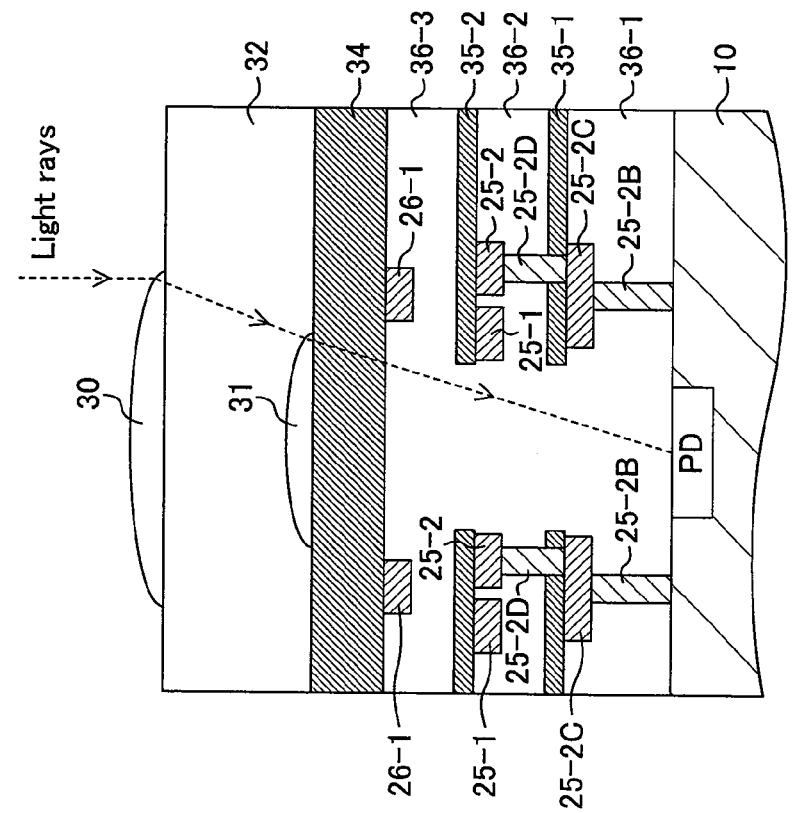
FIG. 11B is a cross-sectional view showing an arrangement with wire shifting in a peripheral pixel.

Therefore, the solid-state imaging device according to the second embodiment of the present invention has a structure as shown in FIGS. 11A and 11B, where openings are provided in the first and second of the first to third wiring protection films 35-1, 35-2 and 34 shown in FIGS. 10A and 10B, with which there is a problem of the interception (reflection) of incident light.

Specifically, FIG. 11A shows an arrangement with no wire shifting in a central pixel of the solid-state imaging device according to the second embodiment of the present invention, where openings are provided in the first and second wiring protection films 35-1 and 35-2, and FIG. 11B shows an arrangement with wire shifting in a peripheral pixel where openings are provided in the first and second wiring protection films 35-1 and 35-2.

As shown in FIG. 11A, in the arrangement with no wire shifting in a central pixel, openings are provided in the first and second wiring protection films 35-1 and 35-2 so that there is an opening above the photodiode PD in the semiconductor substrate 10. As shown in FIG. 11B, in the arrangement with wire shifting in a peripheral pixel, openings are provided so as to correspond to the shifted arrangement of the metal wires/contacts. Then, light incident on the photodiode PD from an oblique direction is prevented from being reflected. The openings are formed so that no opening is formed on a metal wire for the following reason. Normally, a wiring protection film deposited on a metal wire by a CVD (chemical vapor deposition) method, or the like, is dry-etched to form openings. If etching is performed on a metal wire being a copper wire, the metal substance may scatter to contaminate the apparatus.

FIG. 12A shows the arrangement of openings provided in the wiring protection film on the first-layer metal wires in the arrangement of the first-layer metal wires and the first-layer contacts of the solid-state imaging device according to the second embodiment of the present invention, wherein the upper portion of the figure is a plan view showing the arrangement with no wire shifting in a central pixel, and the lower portion thereof is a plan view showing the arrangement with wire shifting in a peripheral pixel; and FIG. 12B shows the arrangement of openings provided in the wiring protection film on the second-layer metal wires in the arrangement of the first-layer contacts and the second-layer metal wires of the solid-state imaging device according to the second embodiment of the present invention, wherein the upper portion of the figure is a plan view showing the arrangement with no wire shifting in a central pixel, and the lower portion thereof is a plan view showing the arrangement with wire shifting in a peripheral pixel.

As shown in FIG. 12A, a region 40-1B where an opening is formed in a peripheral pixel in the lower portion of the figure is shifted according to the shifted arrangement of some of the first-layer metal wires (25-2C, 101-1) with respect to a region 40-1A where an opening is formed in a central pixel in the upper portion of the figure. Similarly, as shown in FIG. 12B, a region 40-2B where an opening is formed in a peripheral pixel in the lower portion of the figure is shifted according to the shifted arrangement of all of the second-layer metal wires (25-1, 25-2, 14-1E) with respect to a region 40-2A where an opening is formed in a central pixel in the upper portion of the figure. It is preferred that the layout of the regions 40-1A and 40-2A where openings are formed changes gradually pixel by pixel from central pixels to peripheral pixels. Then, it is possible to prevent an abnormal line from appearing in the image because of abrupt changes in the light condensing rate (sensitivity) due to abrupt changes in the layout. An opening in a peripheral pixel may be formed to be smaller in area than that in a central pixel for the following reason. It is possible to prevent the deterioration of the light condensing rate even with a smaller opening area as long as the structure is designed so that light is condensed through the on-chip microlens 30 and the inner-layer (condensing) lens 31 so that the spread of light in the horizontal direction (a direction parallel to the surface of the semiconductor substrate 10) as the incident light passes near the opening is sufficiently smaller than the width of the opening.

Openings are not needed in the top-layer (third-layer, in the present embodiment) wiring protection film. Since the inner-layer lens 31 and the third wiring protection film 34 are normally formed by using materials of substantially the same refractive index, there will be no sensitivity deterioration due to the reflection of incident light. Specifically, the inner-layer lens 31 is formed by using an inorganic substance such as a silicon nitride film or a silicon oxynitride film, an acrylic material, a fluorinated resin, or the like, and has substantially the same refractive index as that of the material of the first to third wiring protection films 35-1, 35-2 and 34. However, if a material of a different refractive index is inserted between the top-layer (herein, third-layer) wiring protection film 34 and the inner-layer lens 31, it may be more desirable to form openings. In a case where the organic insulating layer 32 (an acrylic resin, a fluoro resin) is formed as a color filter between the on-chip microlens 30 and the inner-layer lens 31, it is preferably shifted as are the on-chip microlens 30 and the inner-layer lens 31.

—Variation—

Figure 13A:
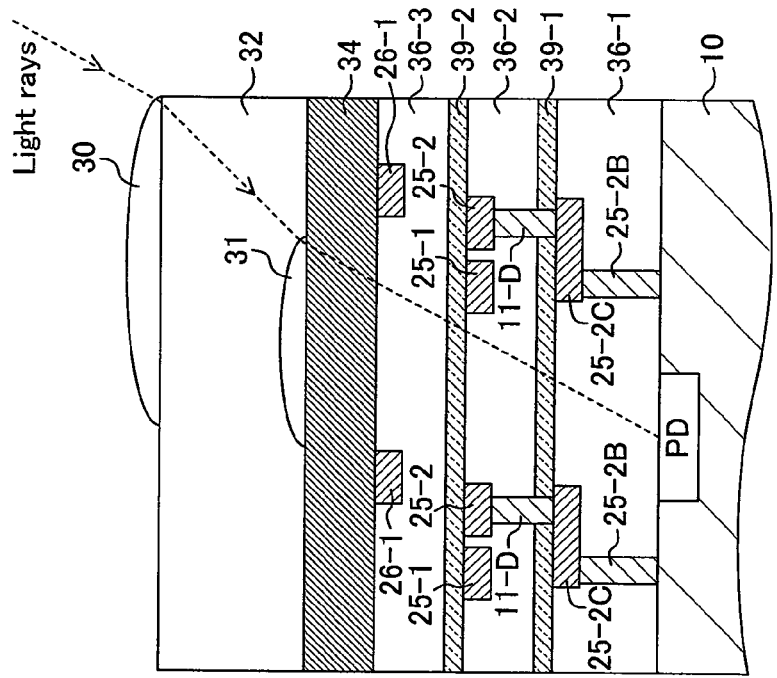
Figure 13B:
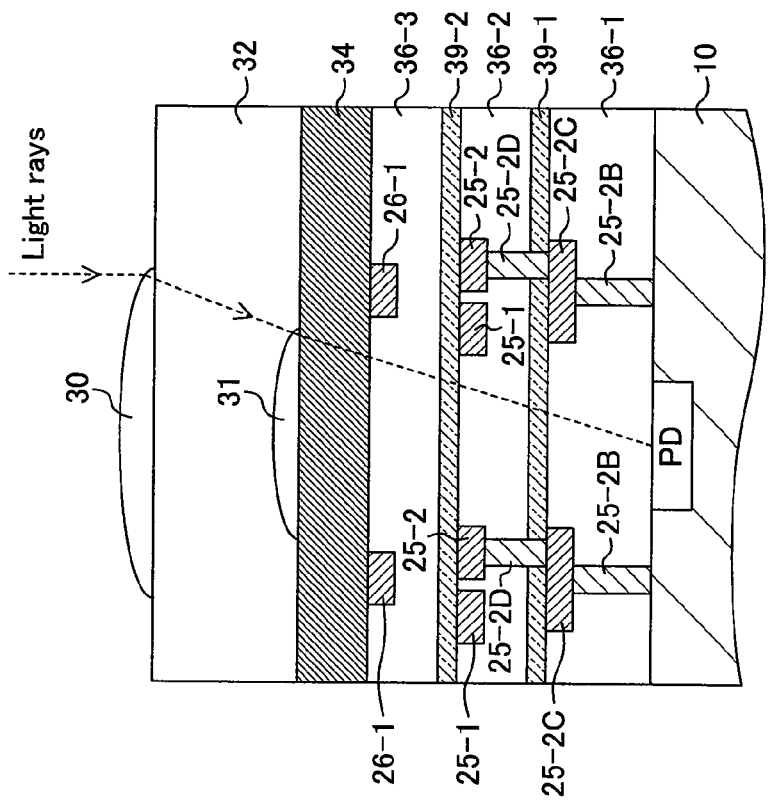
Figure 14:
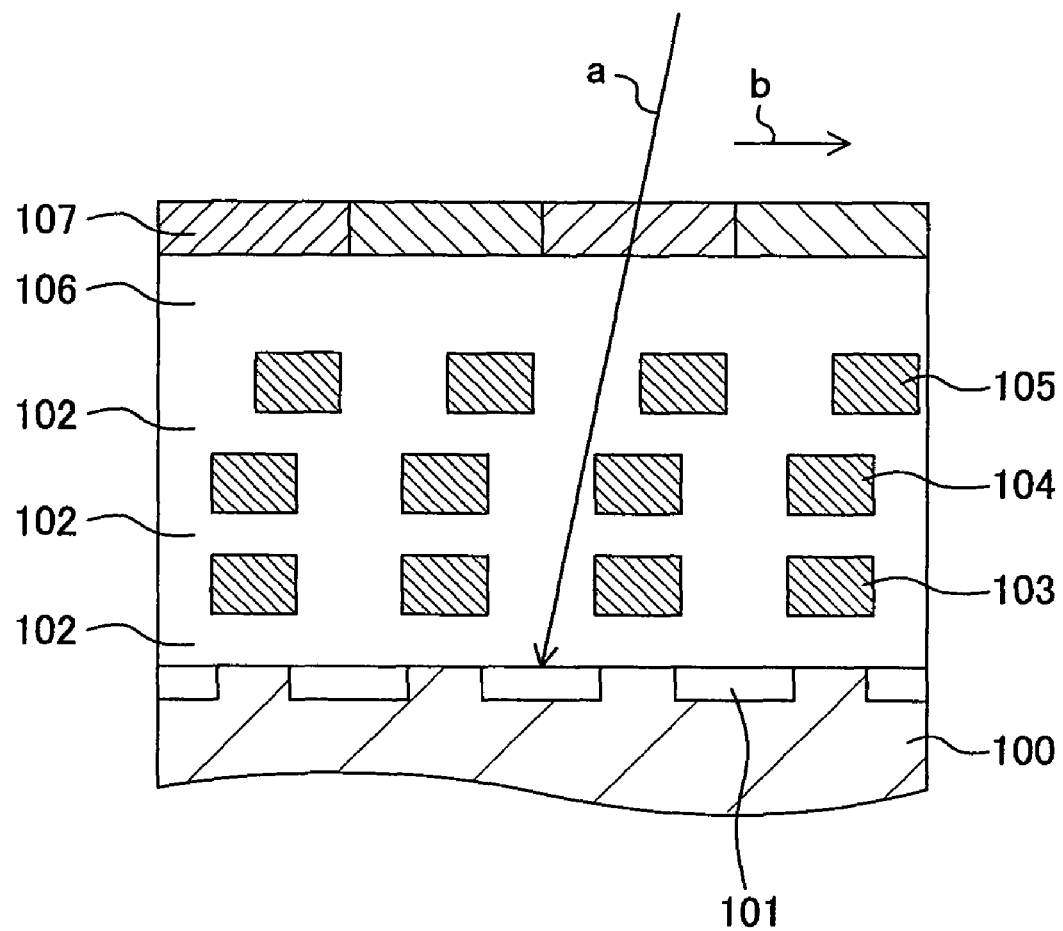
FIG. 14 is a cross-sectional view showing an important part of a structure of a conventional solid-state imaging device.

FIGS. 13A and 13B are cross-sectional views each showing a structure of a solid-state imaging device according to a variation of the second embodiment of the present invention, wherein FIG. 13A is a cross-sectional view showing an arrangement with no wire shifting in a central pixel, and FIG. 13B is a cross-sectional view showing an arrangement with wire shifting in a peripheral pixel.

As compared with the structure of the solid-state imaging device according to the second embodiment of the present invention described above with reference to FIGS. 11A and 11B, the structure of the solid-state imaging device according to the variation of the second embodiment of the present invention shown in FIGS. 13A and 13B differs from the previous structure in that no openings are provided in the first and second wiring protection films but the first and second wiring protection films are formed by using a material capable of serving as an anti-reflection film.

Specifically, a layered film of materials having different refractive indices, e.g., a silicon oxide film or a silicon nitride film (SiN film) and a silicon oxynitride film (SiON film), is used as first and second wiring protection films 39-1 and 39-2, and no openings are formed therein. By optimizing the thicknesses of the first and second wiring protection films 39-1 and 39-2, each being a layered film of such materials, it is possible to significantly reduce the reflection of incident light as compared with a case where they are single-layer SiN films. The layered film forming the first and second wiring protection films 39-1 and 39-2 preferably has a two-layer structure (SiON over SiN) or a three-layer structure (SiN/SiON/SiN). With a layered structure with four or more layers, the processing of the films will be difficult due to the very large film thickness. While a sensitivity deterioration by about 10% is typically expected when using a single-layer SiN film, the sensitivity deterioration can be reduced to about 2% by using a layered film.

The present invention is useful in various image input devices such as video cameras, digital still cameras, facsimiles, etc.

What is claimed is:

1. A solid-state imaging device including an imaging area formed by a plurality of pixels arranged in a matrix pattern on a semiconductor substrate, each pixel including a light-receiving section for photoelectrically converting incident light, the solid-state imaging device comprising:
    a first wiring layer formed on the semiconductor substrate with a first interlayer insulating layer being interposed therebetween, the first wiring layer including a plurality of elements each having a first opening above a corresponding one of the light-receiving sections;

a second wiring layer formed on the first wiring layer with a second interlayer insulating layer being interposed therebetween, the second wiring layer including a plurality of elements each having a second opening above a corresponding one of the light-receiving sections;

a substrate contact running through the first interlayer insulating layer so as to electrically connect an active region of the semiconductor substrate with the first wiring layer; and a first contact running through the second interlayer insulating layer so as to electrically connect the first wiring layer with the second wiring layer, wherein:

an arrangement of the first contact with respect to the light-receiving section of the pixel located in the peripheral portion of the imaging area is shifted from an arrangement of the first contact with respect to the light-receiving section of the pixel located in the central portion of the imaging area, by a shift amount s1 (where 0<s1) from the peripheral portion toward the central portion, an arrangement of the substrate contact with respect to the light-receiving section of the pixel located in a peripheral portion of the imaging area is shifted from an arrangement of the substrate contact with respect to the light-receiving section of the pixel located in a central portion of the imaging area, by a shift amount r (where 0<r) from the peripheral portion toward the central portion; and an arrangement of the first wiring layer with respect to the light-receiving section of the pixel located in the peripheral portion of the imaging area is shifted from an arrangement of the first wiring layer with respect to the light-receiving section of the pixel located in the central portion of the imaging area, by a shift amount s2 (where 0<s2) from the peripheral portion toward the central portion.

2. The solid-state imaging device of claim 1, wherein the shift amount s1 and the shift amount s2 are equal to each other.

3. The solid-state imaging device of claim 1, wherein only some of the elements of the first wiring layer are shifted by the shift amount s2.

4. The solid-state imaging device of claim 3, wherein the some of the elements of the first wiring layer are connected directly to the first contact.

5. The solid-state imaging device of claim 1, further comprising:

a third wiring layer formed on the second wiring layer with a third interlayer insulating layer being interposed therebetween, the third wiring layer including a plurality of elements each having a third opening above a corresponding one of the light-receiving sections; and a second contact running through the third interlayer insulating layer so as to electrically connect the second wiring layer with the third wiring layer, wherein:

an arrangement of the second contact with respect to the light-receiving section of the pixel located in the peripheral portion of the imaging area is shifted from an arrangement of the second contact with respect to the light-receiving section of the pixel located in the central portion of the imaging area, by a shift amount t1 (where 0<t1) from the peripheral portion toward the central portion; and the shift amount t1 is greater than or equal to the shift amount s1.

6. The solid-state imaging device of claim 5, wherein:

an arrangement of the second wiring layer with respect to the light-receiving section of the pixel located in the peripheral portion of the imaging area is shifted from an arrangement of the second wiring layer with respect to the light-receiving section of the pixel located in the central portion of the imaging area, by a shift amount t2 (where 0<t2) from the peripheral portion toward the central portion; and the shift amount t2 is greater than or equal to the shift amount s1.

7. The solid-state imaging device of claim 6, wherein all of the elements of the second wiring layer are shifted by the shift amount t2.

8. The solid-state imaging device of claim 6, wherein the shift amount t2 is equal to the shift amount t1.

9. The solid-state imaging device of claim 5, wherein:

an arrangement of some of the elements of the third wiring layer with respect to the light-receiving section of the pixel located in the peripheral portion of the imaging area is shifted from an arrangement of some of the elements of the third wiring layer with respect to the light-receiving section of the pixel located in the central portion of the imaging area, by a shift amount u1 (where 0<u1) from the peripheral portion toward the central portion;

an arrangement of some other ones of the elements of the third wiring layer with respect to the light-receiving section of the pixel located in the peripheral portion of the imaging area is shifted from an arrangement of some other ones of the elements of the third wiring layer with respect to the light-receiving section of the pixel located in the central portion of the imaging area, by a shift amount u2 (where 0<u2) from the peripheral portion toward the central portion; and the shift amount u1 and the shift amount u2 are different from each other and are greater than the shift amount t1.

10. The solid-state imaging device of claim 5, further comprising:

a first wiring protection film formed between the first wiring layer and the second interlayer insulating layer;

a second wiring protection film formed between the second wiring layer and the third interlayer insulating layer; and a third wiring protection film formed on the third wiring layer.

11. The solid-state imaging device of claim 10, wherein the first wiring protection film and the second wiring protection film are each a layered film formed by using at least two or more of a silicon nitride film, a silicon oxynitride film and a silicon oxide film.

12. The solid-state imaging device of claim 10, wherein:

the first wiring protection film has an opening connected to the first opening above each one of the light-receiving sections; and the second wiring protection film has an opening connected to the second opening above each one of the light-receiving sections.

13. The solid-state imaging device of claim 12, wherein a shape of the opening connected to the first opening and that of the opening connected to the second opening change pixel by pixel from the peripheral portion of the imaging area toward the central portion thereof.

14. The solid-state imaging device of claim 12, wherein a shape of the opening connected to the first opening and that of the opening connected to the second opening in the peripheral portion of the imaging area are different from those in the central portion of the imaging area.

15. The solid-state imaging device of claim 12, wherein:
an area of the opening connected to the first opening provided above the light-receiving section of the pixel located in the peripheral portion of the imaging area is smaller than an area of the opening connected to the first opening provided above the light-receiving section of the pixel located in the central portion of the imaging area; and
an area of the opening connected to the second opening provided above the light-receiving section of the pixel located in the peripheral portion of the imaging area is smaller than an area of the opening connected to the second opening provided above the light-receiving section of the pixel located in the central portion of the imaging area.

16. The solid-state imaging device of claim 12, wherein the third wiring protection film does not have an opening connected to the third opening above each one of the light-receiving sections.

17. The solid-state imaging device of claim 11, wherein:
an arrangement of the opening connected to the first opening provided above the light-receiving section of the pixel located in the peripheral portion of the imaging area is shifted from an arrangement of the opening connected to the first opening provided above the light-receiving section of the pixel located in the central portion of the imaging area, by a shift amount s2 from the peripheral portion toward the central portion; and
an arrangement of the opening connected to the second opening provided above the light-receiving section of the pixel located in the peripheral portion of the imaging area is shifted from an arrangement of the opening connected to the second opening provided above the light-receiving section of the pixel located in the central portion of the imaging area, by a shift amount t2 from the peripheral portion toward the central portion.

18. The solid-state imaging device of claim 1, further comprising an on-chip microlens, a color filter, and an inner-layer lens,
wherein an arrangement of the on-chip microlens, the color filter and the inner-layer lens provided above the light-receiving section of the pixel located in the peripheral portion of the imaging area is shifted from an arrangement of the on-chip microlens, the color filter and the inner-layer lens provided above the light-receiving section of the pixel located in the central portion of the imaging area, from the peripheral portion toward the central portion.

19. The solid-state imaging device of claim 1, wherein the shifting from the peripheral portion toward the central portion is a shifting in a horizontal direction or in a vertical direction.

20. The solid-state imaging device of claim 1, wherein where the substrate contact in the peripheral portion of the imaging area is shifted, the shift amount s1 is greater than the shift amount r.

21. The solid-state imaging device of claim 1, wherein where the substrate contact in the peripheral portion of the imaging area is shifted, the shift amount s2 is greater than the shift amount r.

* * * * *